US012787657B2

(12) United States Patent
Shakh et al.

(10) Patent No.: US 12,787,657 B2
(45) Date of Patent: *Nov. 3, 2026

(54) MAGNETIC MEMORY STRUCTURE

(71) Applicant: Industrial Technology Research Institute, Hsinchu (TW)

(72) Inventors: Ziaur Rahaman Shakh, Hsinchu County (TW); Jeng-Hua Wei, Taipei City (TW); Siddheswar Maikap, Taoyuan City (TW)

(73) Assignee: Industrial Technology Research Institute, Hsinchu (TW)

( * ) Notice: Subject to any disclaimer, the term of this patent is extended or adjusted under 35 U.S.C. 154(b) by 874 days.

This patent is subject to a terminal disclaimer.

(21) Appl. No.: 18/081,698

(22) Filed: Dec. 15, 2022

(65) Prior Publication Data

US 2024/0206347 A1 Jun. 20, 2024

(51) Int. Cl.

*H10N 52/80* (2023.01)
*H10B 61/00* (2023.01)
*H10N 50/10* (2023.01)
*H10N 52/00* (2023.01)

(52) U.S. Cl.

CPC ............. *H10N 52/80* (2023.02); *H10B 61/00* (2023.02); *H10B 61/22* (2023.02); *H10N 50/10* (2023.02); *H10N 52/00* (2023.02)

(58) Field of Classification Search

CPC ........ H10N 50/10; H10N 50/80; H10N 50/85; H10N 52/00; H10N 52/80; H10B 61/00; G11C 11/18; G11C 11/5607

See application file for complete search history.

(56) References Cited

U.S. PATENT DOCUMENTS

| | | | | |
|---|---|---|---|---|
| 8,716,818 | B2 | 5/2014 | Yoshikawa et al. | |
| 8,963,222 | B2 | 2/2015 | Guo | |
| 9,324,403 | B2 | 4/2016 | Khalili Amiri et al. | |
| 9,646,670 | B2 | 5/2017 | Lee et al. | |
| 9,691,458 | B2 | 6/2017 | Ralph et al. | |
| 9,830,968 | B2 | 11/2017 | Shimomura et al. | |
| 9,947,382 | B2 | 4/2018 | Buhrman et al. | |
| 11,227,990 | B2 * | 1/2022 | Shakh .................... | H10N 50/10 |
| 2014/0252439 | A1 | 9/2014 | Guo | |

(Continued)

FOREIGN PATENT DOCUMENTS

| | | |
|---|---|---|
| CN | 111785828 | 10/2020 |
| CN | 111864060 | 10/2020 |

(Continued)

OTHER PUBLICATIONS

M. Morota et al., "Indication of intrinsic spin Hall effect in 4d and 5d transition metals," Physical Review B, May 2011, pp. 1-5.

(Continued)

*Primary Examiner* — Jose R Diaz
(74) *Attorney, Agent, or Firm* — JCIPRNET

(57) ABSTRACT

A magnetic memory structure is provided. The magnetic memory structure includes a plurality of magnetic tunneling junction (MTJ) layers, and a plurality of heavy-metal layers. The plurality of MTJ layers includes: a pinned-layer; a barrier-layer formed under the pinned-layer; and a free-layer formed under the barrier-layer. The plurality of heavy-metal layers is disposed under the free-layer.

20 Claims, 41 Drawing Sheets

(56) References Cited

U.S. PATENT DOCUMENTS

| | | | | |
|---|---|---|---|---|
| 2017/0117027 | A1 | 4/2017 | Braganca et al. | |
| 2018/0040807 | A1 | 2/2018 | Saito et al. | |
| 2020/0075670 | A1 | 3/2020 | Lin et al. | |
| 2023/0263074 | A1* | 8/2023 | Song ...................... | H10N 52/01 257/421 |

FOREIGN PATENT DOCUMENTS

| | | |
|---|---|---|
| CN | 113611793 | 11/2021 |
| CN | 113707804 | 11/2021 |
| CN | 114583046 | 6/2022 |
| CN | 114664879 | 6/2022 |
| TW | I751728 | 1/2022 |
| TW | 202230841 | 8/2022 |

OTHER PUBLICATIONS

J. E. Hirsch, “Spin Hall Effect,” Phys. Rev. Lett., vol. 83, Aug. 1999, pp. 1834-1837.

Joan Mihai Miron et al., “Perpendicular switching of a single ferromagnetic layer induced by in-plane current injection,” Nature, vol. 476, Aug. 2011, pp. 189-194.

Luqiao Liu et al., “Current-induced switching of perpendicularly magnetized magnetic layers using spin torque from the spin Hall effect,” Phys. Rev. Lett., Aug. 2012, pp. 1-5.

Luqiao Liu et al., “Spin-torque switching with the giant spin Hall effect of tantalum,” Science, vol. 336, May 2012, pp. 1-5.

Kevin Garello et al., “Symmetry and magnitude of spin-orbit torques in ferromagnetic heterostructures,” Nature Nanotechnology, vol. 8, Aug. 2013, pp. 587-593.

S. Fukami et al., “A spin-orbit torque switching scheme with collinear magnetic easy axis and current configuration,” Nature Nanotechnology, vol. 11, Jul. 2016, pp. 621-626.

Can Onur Avci et al., “Current-induced switching in a magnetic insulator,” Nature Materials, vol. 16, Mar. 2017, pp. 309-315.

Tomas Jungwirth et al., “Spin Hall effect devices,” Nature Materials, May 2012, pp. 382-390.

Chi-Feng Pai et al., “Spin transfer torque devices utilizing the giant spin Hall effect of tungsten,” Applied Physics Letters, Sep. 2012, pp. 1-5.

Murat Cubukcu et al., “Ultra-Fast Perpendicular Spin-Orbit Torque MRAM,” IEEE Transactions on Magnetics, vol. 54, Apr. 2018, pp. 1-4.

“Office Action of Taiwan Counterpart Application”, issued on Jan. 8, 2024, p. 1-p. 12.

* cited by examiner

MAGNETIC MEMORY STRUCTURE

BACKGROUND

Technical Field

The present invention relates generally to a magnetic random access memory structure, and to spin-orbit torque magnetic random access memory.

Background

The magnetic random access memory (MRAM) based on magnetic tunnel junction (MTJ) storage devices, which consists of two ferromagnetic layers separated by a non-conducting tunnel barrier layer have emerged as very promising candidates for future high performance nonvolatile memory and logic applications. In particular, the spin-transfer torque magnetic random access memory (STT-MRAM) has attracted much attention because of its CMOS compatibility, excellent nonvolatility, high writing and reading speed, and zero leakage power. It has been also identified as a good candidate for the low-level cache memory, embedded flash of the system-on-chip processor, and as an ideal one-memory-for-all for small battery-operated appliances such as the Internet of Things (IoT).

In STT-MRAM, the magnetization of the free-layer (FL) can be changed by applying spin-polarized current directly through the MTJ cell without applying an external magnetic field, therefore magnetic interference is not present, which makes it possible to achieve low-power and high-density features of STT-MRAM Although STT-MRAM has attracted considerable attention worldwide due to its unique features, some significant challenges have to be addressed before this technology being commercialized. The technology is mature to the stage that silicon foundries are producing them. Despite its maturity, there is room for further improvement of its robustness. One of the main drawbacks of STT-MRAM are reliability, including read interference, read and write errors, and possible non-conducting tunnel barrier breakdown due to the same read/write access paths. The reliability of STT-MRAM can indeed be improved if the write current does not pass through the thin non-conducting tunnel barrier layer.

In recent years, MRAMs using an alternative technique for magnetization reversal of MTJ, namely spin-orbit torque (SOT) with separate read and write paths, have been extensively studied as potential candidates for further developing the reliability of current STT-MRAM technology. The main benefit of SOT-MRAM over STT-MRAM is that the read and write paths are independent, which principally solves the problems of reliability and non-conducting tunnel barrier breakdown issues, provides a new pathway for cache memory applications.

In the typical SOT-MRAM, a transverse pure-spin current is generated due to the spin-orbit coupling (SOC) effects at the bulk of the nonmagnetic heavy-metal (HM) layer and/or the interface of the HM/FM layer. When an in-plane charge current is injected into the HM layer of the three-terminal MTJ-based memory cells, a transverse pure-spin current is generated due to the spin-Hall effect and/or interface Rashba effect. The accumulation of spin-polarized electrons at the interface of the HM/FM layer exerts a spin-orbit torque on the FM layer that can switch the magnetization of the FM free-layer of MTJ. Therefore, in SOT-MRAM, the read and write paths are decoupled, which improves the reliability of the tunnel barrier layer and also the endurance of the device since the write current does not flow through the tunnel barrier layer. In addition, the read disturbance in SOT-MRAM is also alleviated due to the separate read and write paths.

Interest in the development of SOT-MRAM has been generated in recent years due to the device's advantageous performance, low-voltage operation, high-speed, and compatibility with advanced CMOS technology. To achieve reliable switching, there is a need in the technology for innovative structures that offer improved SOT-MRAM.

SUMMARY

According to one embodiment of this disclosure, a magnetic memory structure is provided. The magnetic memory structure includes a plurality of magnetic tunneling junction (MTJ) layers, and a plurality of heavy-metal layers. The plurality of MTJ layers includes: a pinned-layer; a barrier-layer formed under the pinned-layer; and a free-layer formed under the barrier-layer. The plurality of heavy-metal layers is disposed under the free-layer.

According to another embodiment of this disclosure, a magnetic memory structure is provided. The magnetic memory structure includes: a plurality of magnetic tunneling junction (MTJ) layers; and a plurality of heavy-metal layers. The plurality of heavy-metal layers is disposed below the plurality of MTJ layers. The plurality of heavy-metal layers includes a first heavy-metal layer and a second heavy-metal layer, and the first heavy-metal layer and the second heavy-metal layer is separated by an oxide layer. The first heavy-metal layer is disposed below the plurality of MTJ layers. The first heavy-metal layer is disposed below the free-layer. The second heavy-metal layer is disposed below the oxide layer.

According to another embodiment of this disclosure, a magnetic memory structure is provided. The magnetic memory structure includes: a plurality of magnetic tunneling junction (MTJ) layers; a plurality of heavy-metal layers; and a conductive layer. The conductive layer is disposed below the plurality of heavy-metal layers. The conductive layer is disposed below the second heavy-metal layer. An electric conductivity of the conductive layer is higher than an electric conductivity of the second heavy-metal layer.

DESCRIPTION OF THE EMBODIMENTS

Figure 1A:
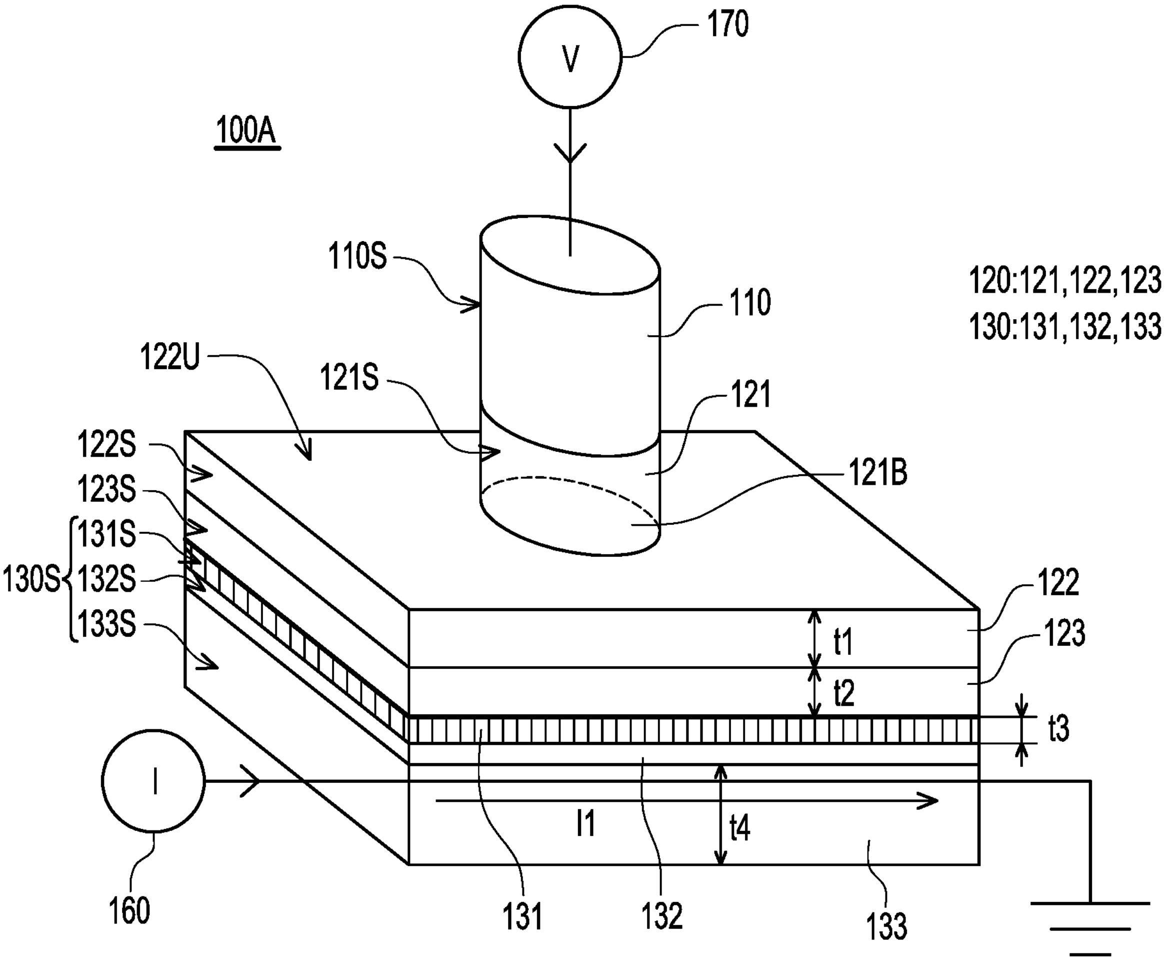
FIGS. 1A to 1C illustrate schematic diagrams of a magnetic memory structure according to an embodiment of the present disclosure.

Following embodiments are provided in collaboration with the accompanying drawings for detailed description, but the provided embodiments are not used to limit a scope of the disclosure. In addition, component sizes in the drawings are drawn for convenience of explanation, and do not represent the actual component sizes. Moreover, although “first”, “second”, etc. are used in the text to describe different components and/or film layers, these components and/or film layers should not be limited to these terms. Rather, these terms are only used to distinguish one component or film layer from another component or film layer. Therefore, a first component or film layer discussed below may be referred to as a second element or film layer without departing from the teachings of the embodiments. To facilitate understanding, similar components are described with the same symbols in the following description.

In the description of the embodiments of the disclosure, different examples may use repeated reference symbols and/or words. These repeated symbols or words are for the purpose of simplification and clarity, and are not used to limit a relationship between the various embodiments and/or the appearance structure. Furthermore, if the following disclosure of the specification describes that a first feature is formed on or above a second feature, it means that it includes an embodiment in which the formed first feature and the second feature are in direct contact, and also includes an embodiment in which an additional feature is formed between the first feature and the second feature, so that the first feature and the second feature may not be in direct contact. To facilitate understanding, similar components are described with the same symbols in the following description.

Figure 1B:
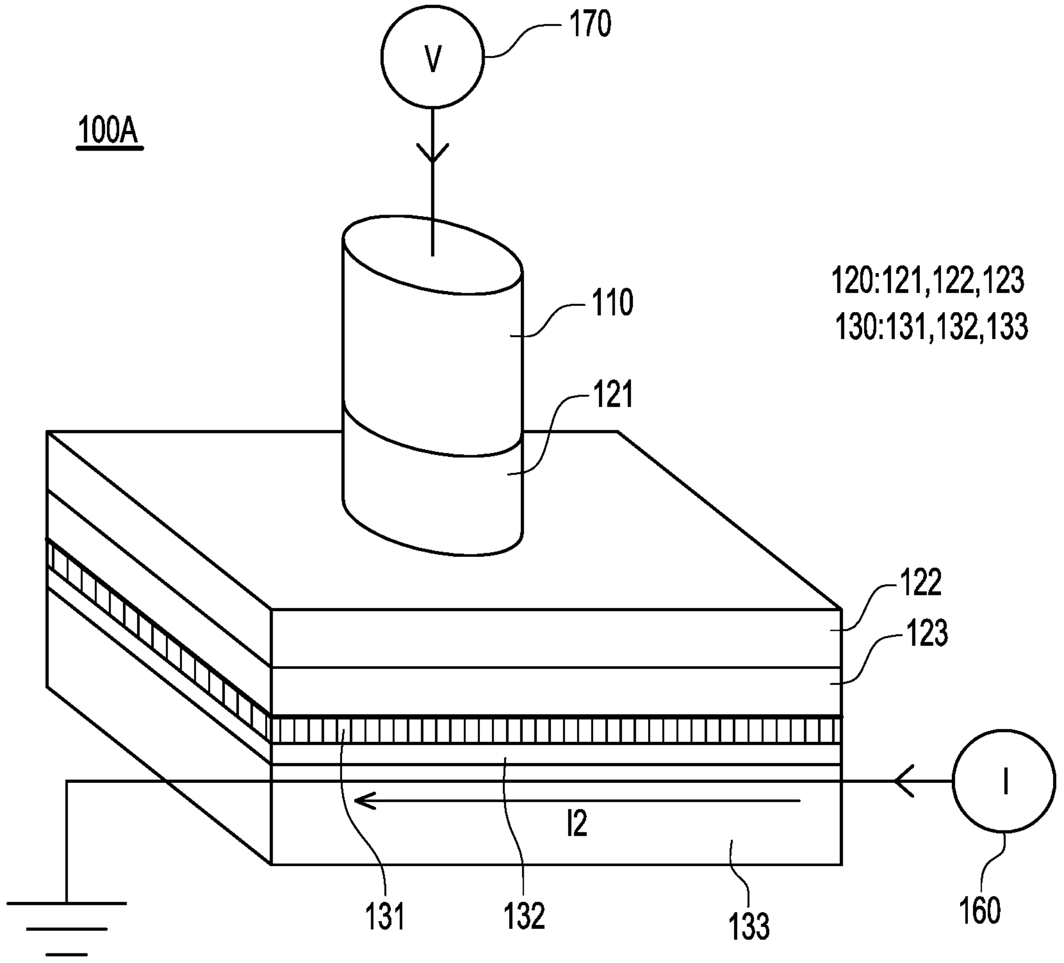

Referring to FIGS. 1A and 1B. FIGS. 1A and 1B illustrate schematic diagrams of a magnetic memory structure 100A according to an embodiment of the present disclosure.

The magnetic memory structure 100A is a kind of magnetic random access memory (MRAM), for example, a spin-orbit torque (SOT)-MRAM. The magnetic memory structure 100A includes a top electrode 110, a magnetic tunneling junction (MTJ) layer 120, a heavy-metal layer 130.

The top electrode 110 is formed on and above the MTJ layer 120. The top electrode 110 is configured to receive a read voltage applied by a voltage source 170 for reading the state of the MTJ layer 120.

The MTJ layer 120 includes a pinned-layer 121, a barrier-layer 122 and a free-layer 123. The barrier-layer 122 is formed under the pinned-layer 121, and the free-layer 123 is formed under the barrier-layer 122, that is, the barrier-layer 122 lies between the pinned-layer 121 and the free-layer 123.

The top electrode 110 has a lateral surface 110S and the pinned-layer 121 of the MTJ layer 120 has a lateral surface 121S respectively. In one etching process, the top electrode 110 and the pinned-layer 121 are etched, by the same mask, to form the lateral surface 110S and lateral surface 121S. Thus, the lateral surface 110S and lateral surface 121S are substantially aligned with each other. As shown in FIG. 1A, the top electrode 110 and the pinned-layer 121 are shaped into the same elliptic shape. In some embodiments, shape of the top surface of the top electrode 110 may be a circular shape, or a polygonal shape, for example, rectangular shape or square shape, or other suitable shapes, which is not limited thereto.

In addition, an area of a bottom surface 121B of the pinned-layer 121 is smaller than an area of a top surface 122U of the barrier-layer 122. As illustrated in FIG. 1A, the bottom surface 121B of the pinned-layer 121 is entirely located at the top surface 122U of the barrier-layer 122.

Since the barrier-layer 122 is made of a material different from that of the pinned-layer 121, the barrier-layer 122 could serve as an etching stop layer for obtaining accurate thicknesses of the pinned-layer 121 and/or the barrier-layer 122. To be an etching stop layer, the top surface 122U of the barrier-layer 122 is larger than the bottom surface 121B of the pinned-layer 121. In an embodiment, the barrier-layer 122 is made of an insulation material including MgO or combination thereof which is different form magnetic material of the pinned-layer 121.

As illustrated in FIG. 1A, a heavy-metal layer 130 is disposed under the free-layer 123. The heavy-metal layer 130 includes a first heavy-metal layer 131, an oxide layer 132, and a second heavy-metal layer 133. The first heavy-metal layer 131 is formed under the free-layer 123. The second heavy-metal layer 133 is formed under the first heavy-metal layer 131. The oxide layer 132 is formed between the first heavy-metal layer 131 and the second heavy-metal layer 133. The first heavy-metal layer 131 has a first work function, the second heavy-metal layer 133 has a second work function, and the first work function is lower than the second work function.

As illustrated in FIG. 1A, the first heavy-metal layer 131 has a first thickness, the second heavy-metal layer 133 has a second thickness, and the first thickness is lower than the second thickness. In some embodiments, the first heavy-metal layer 131 has a first thickness lower than 2 nm, but is not limited thereto. In some embodiments, the second heavy-metal layer 133 has a second thickness lower than 10 nm, but is not limited thereto.

The barrier-layer 122 has a lateral surface 122S, the free-layer 123 has a lateral surface 123S, and the heavy-metal layer 130 has a lateral surface 130S respectively. The lateral surface 130S of the heavy-metal layers 130 includes a lateral surface 131S of the first heavy-metal layer 131, a lateral surface 132S of the oxide layer 132, and a lateral surface 133S of the second heavy-metal layer 133. In one etching process, the barrier-layer 122, the free-layer 123 and the heavy-metal layer 130 are etched, by the same mask, to form the lateral surface 122S, the lateral surface 123S and the lateral surface 130S (including lateral surfaces 131S, 132S and 133S). Thus, the lateral surface 122S of the barrier-layer 122, the lateral surface 123S of the free-layer 123 and the lateral surface 130S of the heavy-metal layer 130 are substantially aligned (or flush) with each other. Also, for the heavy-metal layer 130, the lateral surface 131S of the first heavy-metal layer 131, the lateral surface 132S of the oxide layer 132, and the lateral surface 133S of the second heavy-metal layer 133 are also substantially aligned (or flush) with each other. As shown in FIG. 1A, the barrier-layer 122, the free-layer 123 and the heavy-metal layer 130 are shaped into the same polygonal shape, for example, rectangular shape or square shape.

In some embodiments, the pinned-layer 121 may include a single layer or a composite layer. In some embodiments, the pinned-layer 121 may include a single layer of, for example, cobalt iron (CoFe) alloy, cobalt iron boron (CoFeB) alloy, or cobalt nickel (CoNi) alloy. In some embodiments, the pinned-layer 121 may include a composite layer of, for example, cobalt (Co)/platinum (Pt), cobalt (Co)/nickel (Ni), or cobalt (Co)/palladium (Pd).

In some embodiments, the barrier-layer 122 may include magnesium oxide (MgO) or aluminum oxide (AlOx). In some embodiments, the thickness t1 of the barrier-layer 122 is in a range from about 0.5 nm to 2 nm.

In some embodiments, the free-layer 123 may include a single layer or a composite layer. In some embodiments, the free-layer 123 may include a single layer of, for example, iron (Fe), cobalt (Co), nickel (Ni), gadolinium (Gd), terbium (Tb), cobalt iron boron (CoFeB) alloy, or cobalt iron (CoFe) alloy. In some embodiments, the free-layer 123 may include a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe). In addition, in some embodiments, the thickness t2 of the free-layer 123 is in a range from about 1 nm to about 3 nm.

In some embodiments, the first heavy-metal layer 131 may be made of a material including Tungsten (W), Tantalum (Ta), Hafnium (Hf or an alloy thereof, but not limited thereto. In some embodiments, the second heavy-metal layer 133 may be made of a material including Platinum (Pt), Iridium (Ir), gold (Au), or combination thereof, but not limited thereto. In some embodiments, the material of the oxide layer 132 includes magnesium oxide (MgO), silicon oxide ($SiO_2$), hafnium oxide ($HfO_2$), or combination thereof, but not limited thereto. In some embodiments, a thickness t3 of the first heavy-metal layer 131 is smaller than a thickness t4 of the second heavy-metal layer 133. In some embodiments, the thickness t3 of the first heavy-metal layer 131 is smaller than about 2 nm. In some embodiments, the thickness t4 of the second heavy-metal layer 133 is smaller than about 10 nm.

As illustrated in FIG. 1A, in a write program, the electric current I1 is applied by the current source 160 to flow through the second heavy-metal layer 133 in order for switching the state of the free-layer 123 of the MTJ layer 120 to state "1" from state "0" (or to state "0" from state "1"), wherein the state "0" represents that, for example, the magnetization directions of the pinned-layer 121 and the free-layer 123 are the same, which is the parallel state (P state), and the state "1" represents that, for example, the magnetization directions of the pinned-layer 121 and the free-layer 123 are opposite, which is the anti-parallel state (AP state).

As illustrated in FIG. 1B, in another write program, the reverse electric current I2 is applied by the current source 160 to flow through the second heavy-metal layer 133 in an opposite direction compare to electric current I1 as shown in FIG. 1A in order for switching the state of the free-layer 123 of the MTJ layer 120 to state "0" from state "1" (or to state "1" from state "0").

Figure 2:
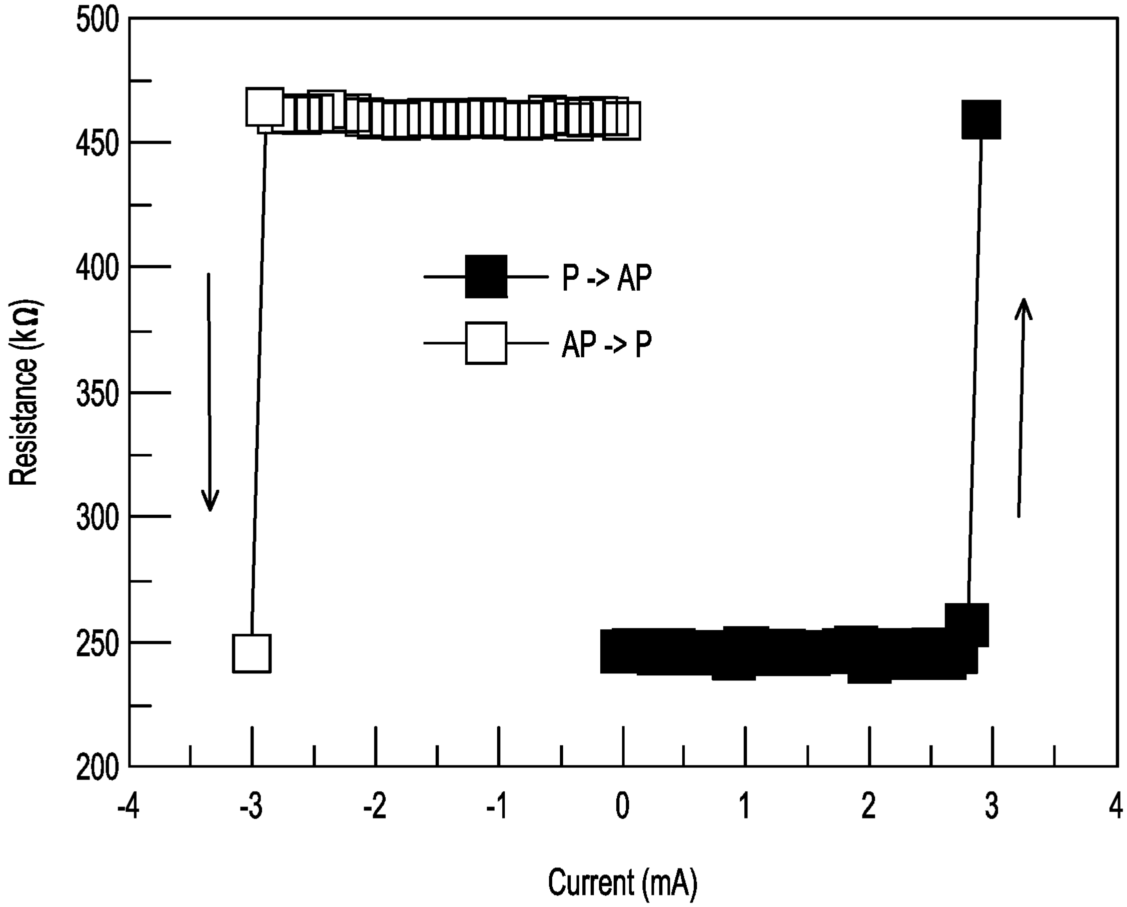
FIG. 2 illustrates a resistance versus current density (R-J) hysteresis curve for the magnetic memory structure.

Please refer to FIGS. 1A, 1B and FIG. 2. In FIGS. 1A, 1B and FIG. 2, the read voltage is applied by the voltage source 170 between the top electrode 110 and one side of the second heavy-metal layer 133 which the electric current I1 flows in to the second heavy-metal layer 133, or between the top electrode 110 and the other side of the second heavy-metal layer 133 which the electric current I1 flows out from the second heavy-metal layer 133 to read the parallel (P) state or anti-parallel (AP) state resistances during the write operation. In an embodiment, the required read voltage is, for example, 0.1 Volt (V), more or less.

In the present embodiment of the proposed SOT-MRAM structure, by controlling write operation as mentioned above, electrons from the second heavy-metal layer 133 which have the high work function tunnel through the oxide layer 132 to the first heavy-metal layer 131 which have the low work function. In this way, the switching thresholds of the magnetic memory with a multi-layered heavy-metal structure can be lower than those of a magnetic memory with a single heavy-metal layer structure.

As shown in FIG. 2, in a SOT-MRAM cell such as the magnetic memory structure 100A, the positive current drives the magnetic memory structure 100A into a high-resistance state (HRS). For example, as shown in FIG. 2, the resistance increases from about 250 kΩ to about 450 kΩ when the current is positive. On the other hand, the negative current (opposite direction) drives the magnetic memory structure 100A into a low-resistance state (LRS). For example, as shown in FIG. 2, the resistance decreases from about 450 kΩ to about 250 kΩ when the current is negative (opposite direction). Thus, the magnetization of the free-layer 123 could be changed by applying electric current directly through the second heavy-metal layer 133 of the heavy-metal layer 130. As shown in FIG. 2, when the positive electric current reaches a threshold value (for example, 3 mA as shown in FIG. 2), the state of the free-layer 123 of the MTJ layer 120 is allowed to change from from P state to AP state with respect to pinned-layer 121 of the MTJ layer 120. When the negative electric current (opposite direction) is lower than a threshold value (for example, −3 mA as shown in FIG. 2), the state of the free-layer 123 of the MTJ layer 120 is allowed to change from from AP state to P state with respect to pinned-layer 121 of the MTJ layer 120.

Figure 1C:
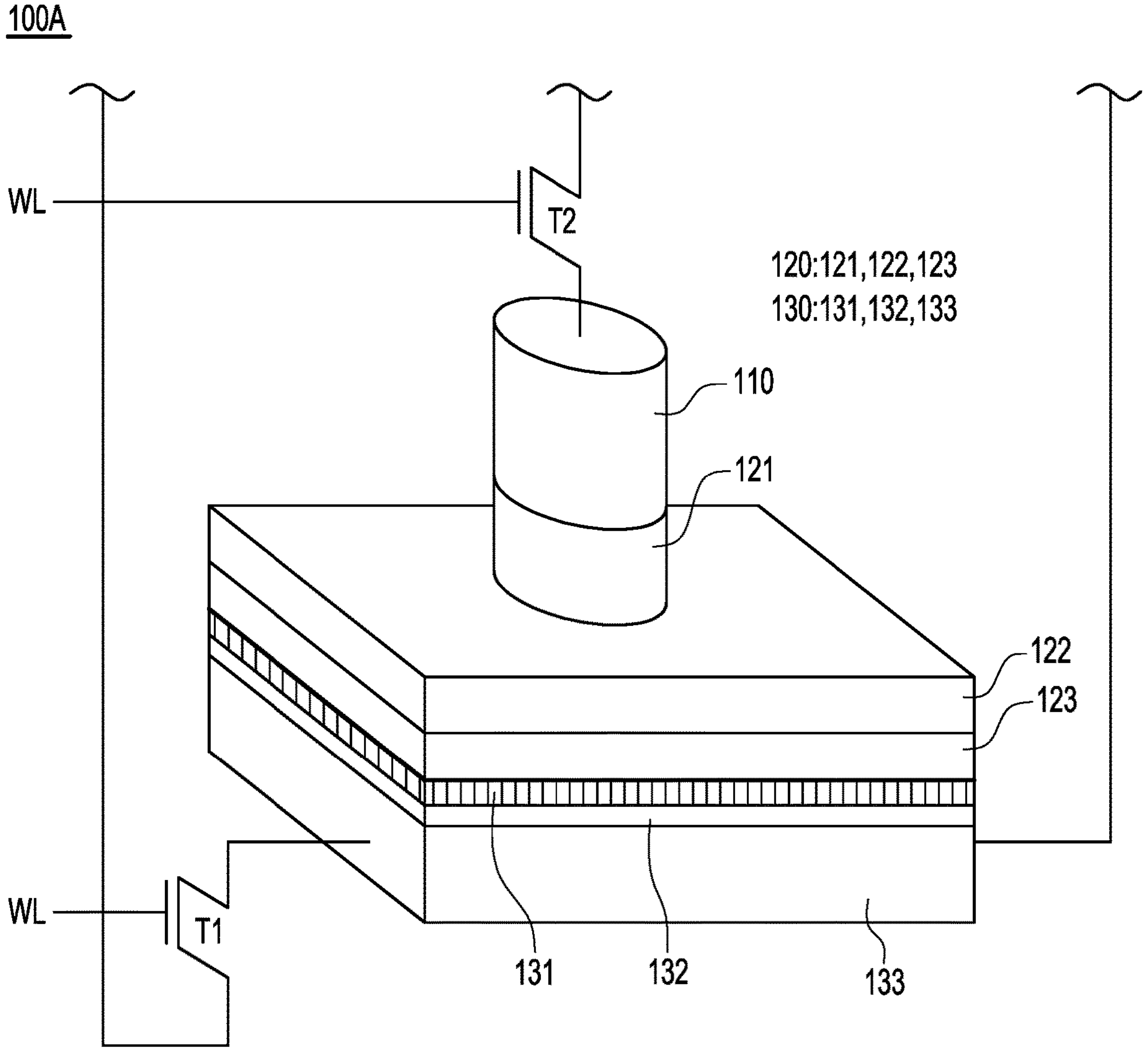

Please refer to FIG. 1C. As illustrated in FIG. 1C, two transistors T1 and T2 are connected to the magnetic memory structure 100A. The first transistor T1 is connected to the second heavy-metal layer 133. The passage of the electric current I1 or I2 to the second heavy-metal layer 133 is controlled by the first transistor T1. Thus, the states of the free-layer 123 the MTJ layer 120 could be controlled/switched by the first transistor T1.

As further illustrate in FIG. 1C, the second transistor T2 is connected to the top electrode 110. The second transistor T2 can be used to read the parallel (P) state or anti-parallel (AP) state resistances during the write operation of the first transistor T1. In another embodiment, the second transistor T2 can be used to control the current flow or write operation through the top electrode 110 to the MTJ layer 120 and exit through either end of the second heavy-metal layer 133, which switches the state of the free-layer 123 of the MTJ layer 120 to state "1" from state "0" (or to state "0" from state "1"), wherein the state "0" represents that, for example, the magnetization directions of the pinned-layer 121 and the free-layer 123 are the same, which is the parallel state, and the state "1" represents that, for example, the magnetization directions of the pinned-layer 121 and the free-layer 123 are opposite, which is the anti-parallel state. In this type of write operation, the magnetic memory structure 100A is treated like a spin-transfer torque magnetic random access memory (STT-MRAM). Thus, the write operation can be performed by applying current either through transistor T1 or through transistor T2, or through both transistors T1 and T2 simultaneously.

Figure 1D:
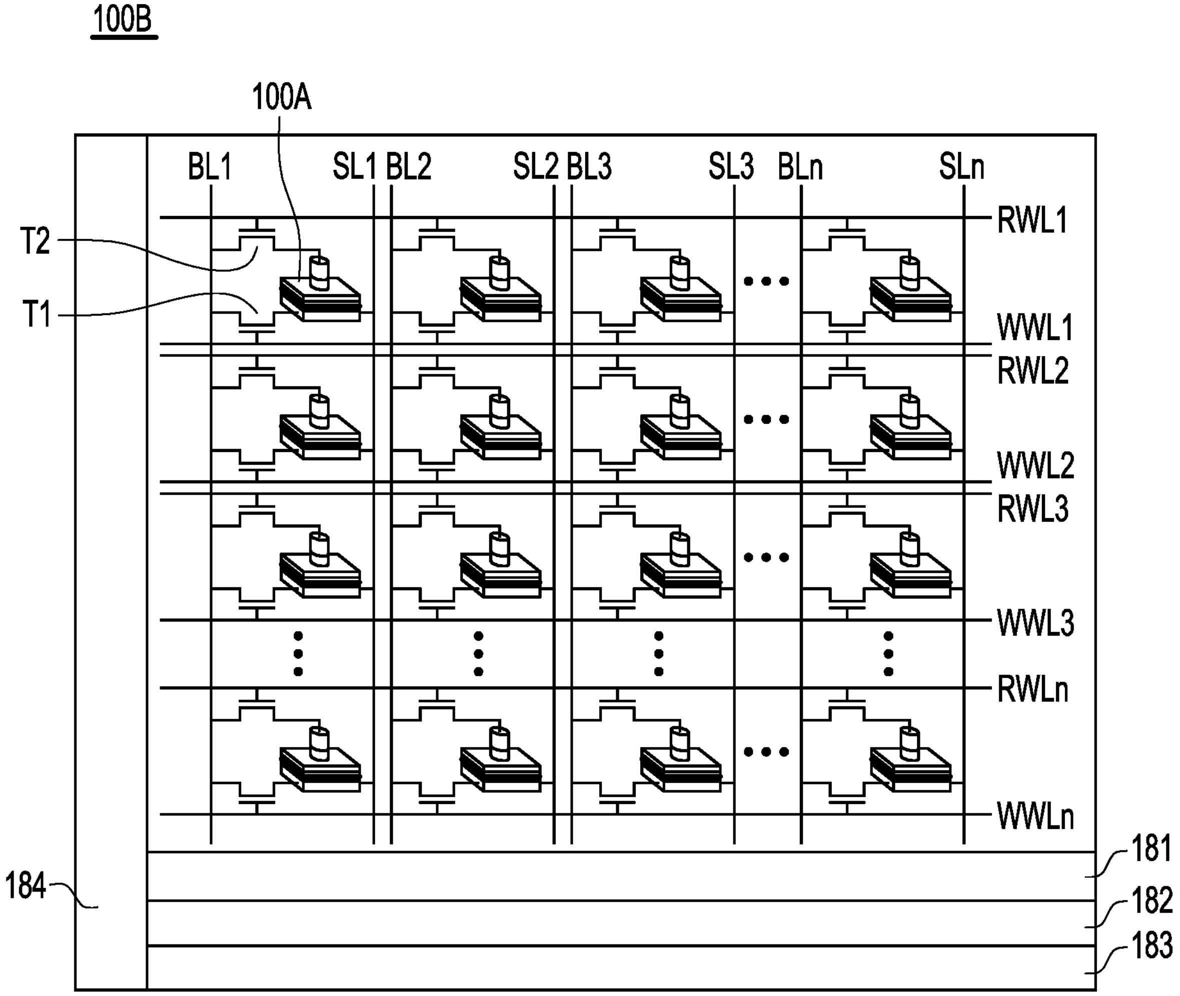
FIGS. 1D to 1E illustrate schematic diagrams of an array structure of a magnetic memory structure according to an embodiment of the present disclosure.

Please refer to FIG. 1D. FIG. 1D is a memory array 100B formed by the memory cells with magnetic memory structure 100A, as shown in FIG. 1A. The memory array 100B further includes a write drive and sense amplifier 181, an X address decoder and multiplexer 182, an output driver 183, and a Y address decoder and word line driver 184 to control the read/write state of each memory cell in the memory array 100B.

A first transistor T1 is connected to the second heavy-metal layer 133 of the magnetic memory structure 100A. A second transistor T2 is connected to the top electrode 110 of the magnetic memory structure 100A. The bit line BL1 connects the first transistor T1 and the second transistor T2. With this arrangement, the switching of the state of free-layer 123 of the MTJ layer 120, or the write operation is done by applying current through the second heavy-metal layer 133, which is through the bit line BL1 and the first transistor T1. This write operation is treating the memory cells of the memory array 100B as the SOT-MRAM. The reading operation is by applying the read voltage between the top electrode 110 and the second heavy-metal layer 133 through the bit line BL1 and the second transistor T2, to read the parallel (P) state or anti-parallel (AP) state resistances during the write operation.

Figure 1E:
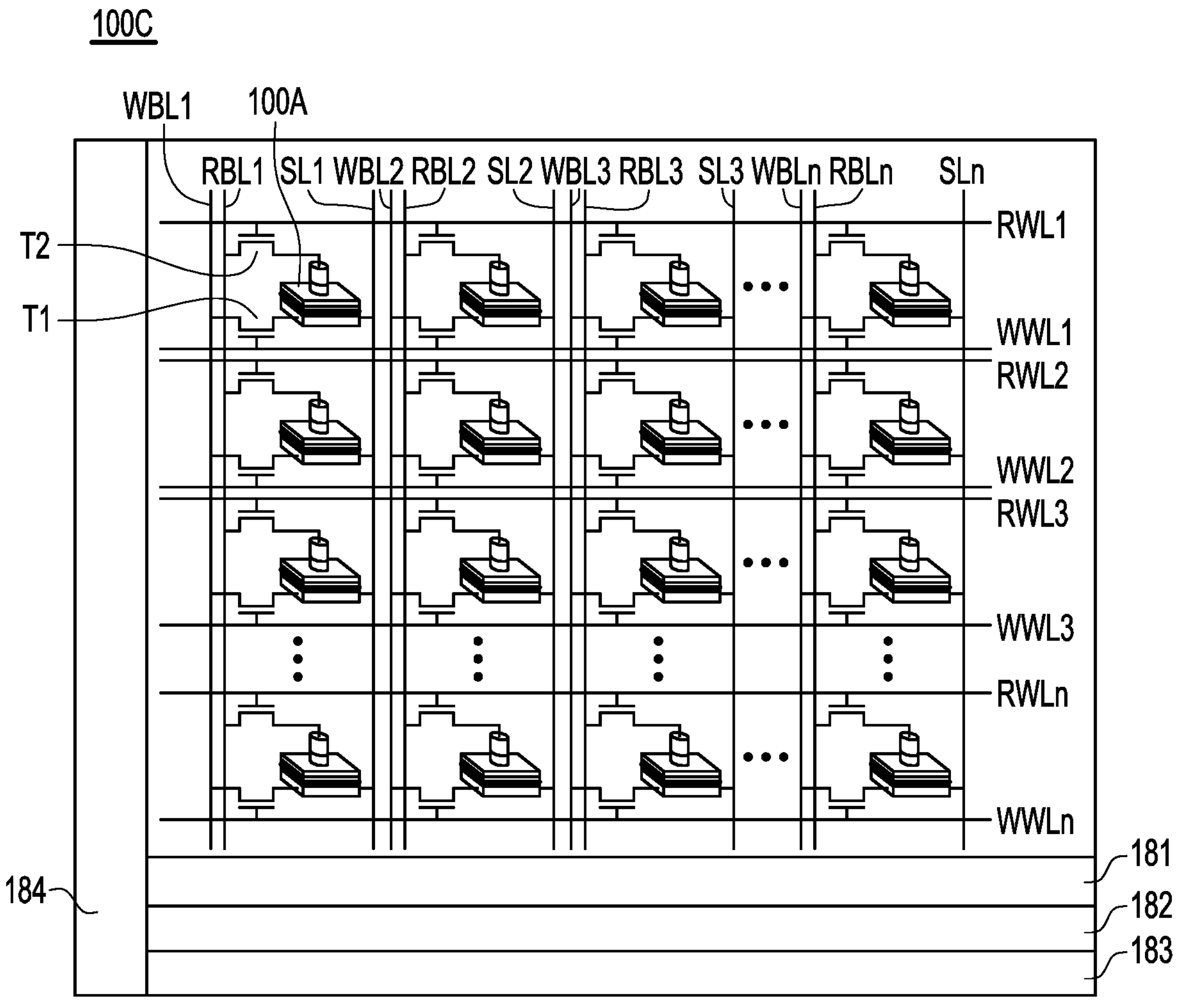

Please refer to FIG. 1E. FIG. 1E is a memory array 100C formed by the memory cells with magnetic memory structure 100A, as shown in FIG. 1A. The structure of the memory array 100C is similar to the structure of the memory array 100B shown in FIG. 1D, thus the similar features are not repeated here. The difference is the following. In the memory array 100C, instead of connecting the first transistor T1 and the second transistor T2 through a single bit line BL1, the first transistor T1 is connected to a bit line WBL1, and the second transistor T2 is connected to another bit line RBL1. In other words, the first transistor T1 and the second transistor T2 are connected to different bit line respectively. In this arrangement, the switching of the state of free-layer 123 of the MTJ layer 120, or the write operation is done by applying current through the second heavy-metal layer 133, which is through the bit line WBL1 and the first transistor T1. Also, a second type of write operation can also be done by applying current through the free-layer 123 of the MTJ layer 120, which is through the bit line RBL1 and the second transistor T2. In this second type of write operation, the magnetic memory structure 100A is treated like a spin-transfer torque magnetic random access memory (STT-MRAM). Also, a third type of write operation can also be performed by applying current through both transistors T1 (and bit line WBL1) and T2 (or bit line RBL1) simultaneously. Thus, compare to the memory array 100B shown in FIG. 1D, the memory array 100C has three different type of write operation to write the memory cell of the memory array 100C, which increases the usage flexibility of the memory array.

Figure 3A:
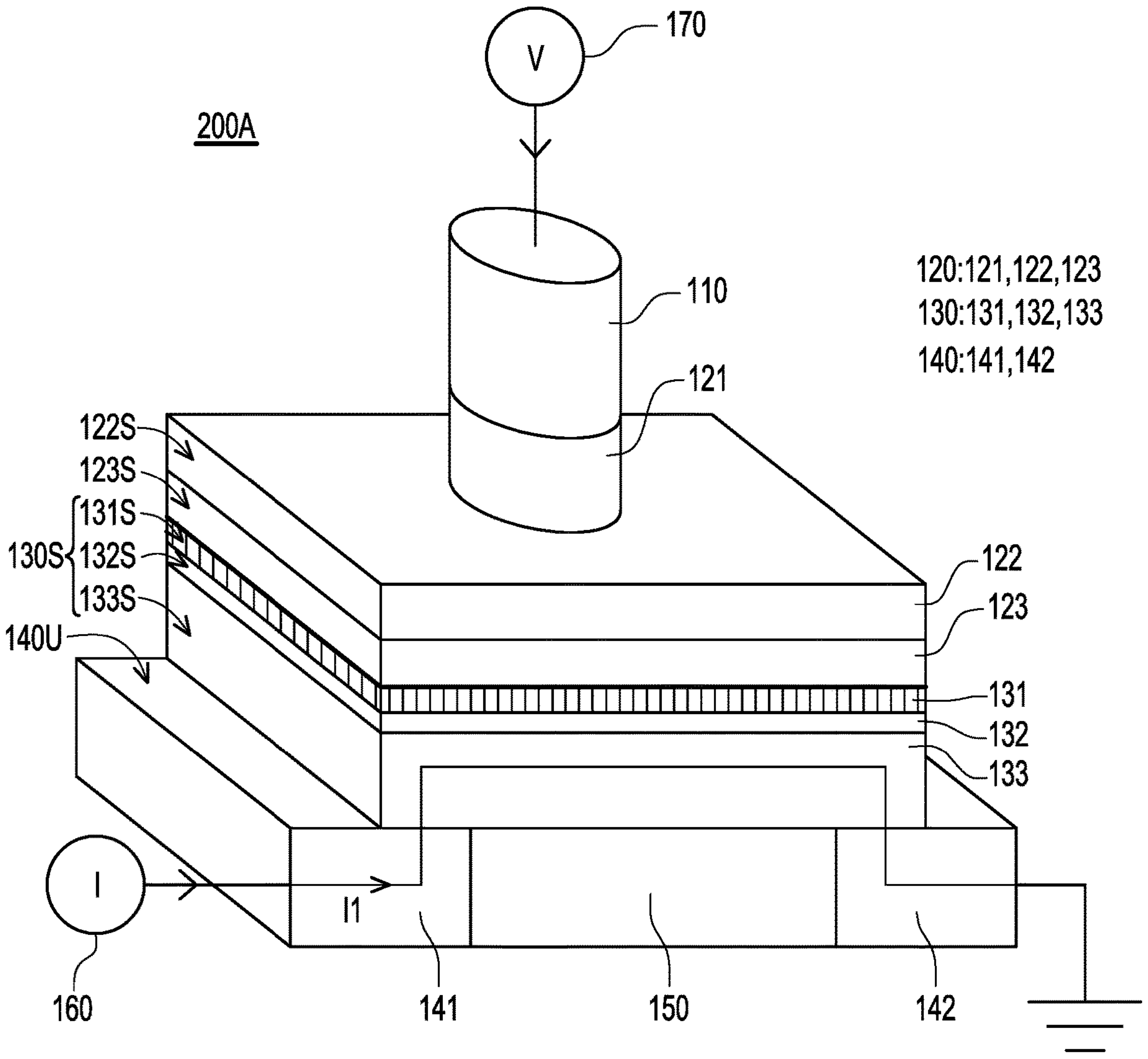
FIGS. 3A to 3C illustrate schematic diagrams of a magnetic memory structure according to an embodiment of the present disclosure.
Figure 3B:
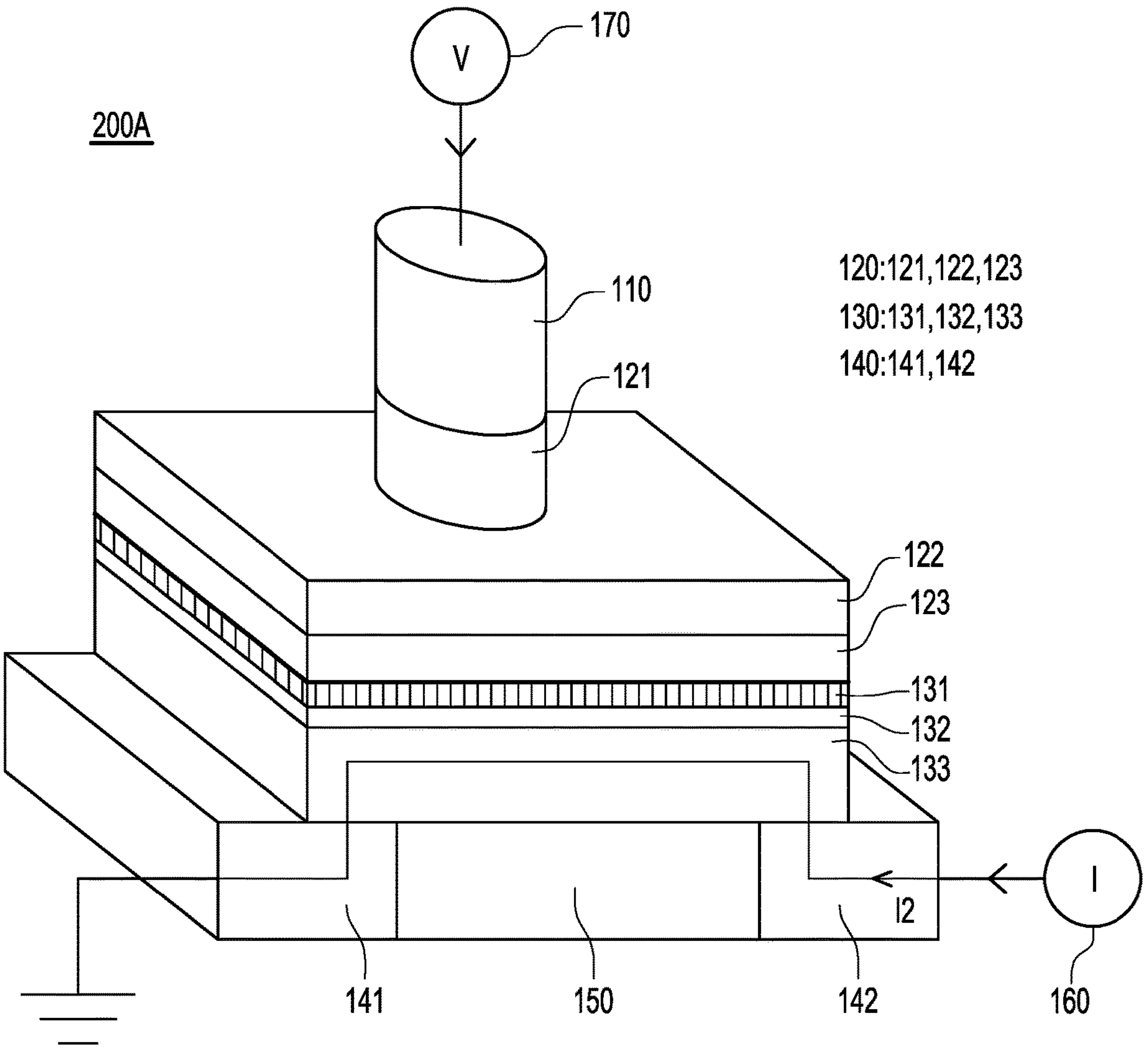

Referring to FIGS. 3A and 3B. FIGS. 3A and 3B illustrate schematic diagrams of a magnetic memory structure 200A according to an embodiment of the present disclosure. The magnetic memory structure 200A is similar to the magnetic memory structure 100A shown in FIGS. 1A and 1B, thus the similar features are not repeated here. In FIGS. 3A and 3B, the magnetic memory structure 200A further includes a conductive layer 140 being formed below the second heavy-metal layer 133.

The conductive layer 140 includes a first conductive portion 141 and a second conductive portion 142 separated from each other, and the first conductive portion 141 and the second conductive portion 142 are connected to two ends of the second heavy-metal layer 133. The conductive layer 140 has an electric conductivity higher than that of the second heavy-metal layer 133. In comparison with the structure without the conductive layer 140, such as the magnetic memory structure 100A shown in FIGS. 1A and 1B, the conductive layer 140 in the present embodiment could increase the electric conductivity of the whole of the second heavy-metal layer 133 and the conductive layer 140, and thus it could decease the driving voltage for the electric current I1 of FIG. 1A and the electric current I2 of FIG. 1B. In addition, in an embodiment, the conductive layer 140 is made of a material including Ag, Cu, Au, Al or combination thereof.

As illustrated in FIG. 3A, in a write program, the electric current I1 is applied by the current source 160 to flow through the first conductive portion 141, the second heavy-metal layer 133, and the second conductive portion 142 in order for switching the state of the free-layer 123 of the MTJ layer 120 to state "1" from state "0" (or to state "0" from state "1"), wherein the state "0" represents that, for example, the magnetization directions of the pinned-layer 121 and the free-layer 123 are the same, and the state "1" represents that, for example, the magnetization directions of the pinned-layer 121 and the free-layer 123 are opposite.

As illustrated in FIG. 3B, in another write program, the reverse electric current I2 is applied to flow through the second conductive portion 142, the second heavy-metal layer 133 and the first conductive portion 141 in order for switching the state of the free-layer 123 of the MTJ layer 120 to state "0" from state "1" (or to state "1" from state "0").

In FIGS. 3A and 3B, the read voltage is applied between the top electrode 110 and the first conductive portion 141 or between the top electrode 110 and second conductive portion 142 to read the parallel (P) state or anti-parallel (AP) state resistances during the write operation. In an embodiment, the required read voltage is, for example, 0.1 Volt (V), more or less.

Since the conductive layer 140 is made of a material different form that of the heavy-metal layer 130, which includes the first heavy-metal layer 131, the oxide layer 132 and the second heavy-metal layer 133, the conductive layer 140 could serve as an etching stop layer for obtaining accurate thicknesses of the heavy-metal layer 130.

As illustrated in FIG. 3A, the conductive layer 140 has a top surface 140U exposed from the heavy-metal layer 130. In other words, as illustrated in FIG. 3A, the conductive layer 140 extends beyond the lateral surface 133S of the second heavy-metal layer 133, the lateral surface 132S of the oxide layer 132, the lateral surface 131S of the first heavy-metal layer 131, the lateral surface 123S of the free-layer 123 and the lateral surface 122S of the barrier-layer 122.

As illustrated in FIG. 3A, the insulation layer 150 fills up an interval between the first conductive portion 141 and the second conductive portion 142 to separate the first conductive portion 141 and the second conductive portion 142.

Figure 3C:
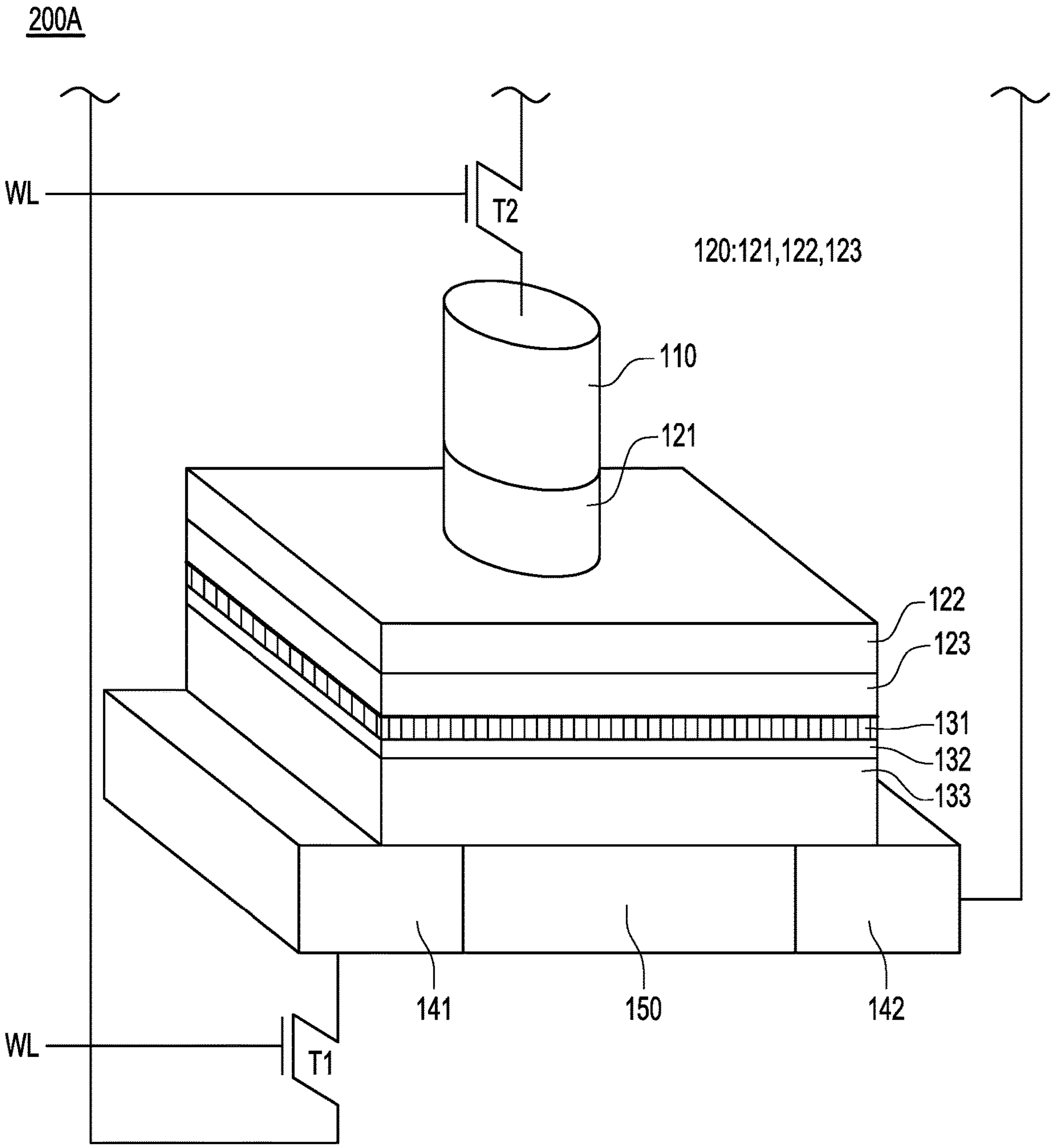

Please refer to FIG. 3C. FIG. 3C is similar to FIG. 1C, thus the similar features are not repeated here. The difference is the following. As illustrated in FIG. 3C, the first transistor T1 is connected to the first conductive portion 141. The passage of the electric current I1 or I2 to conductive layer 140 is controlled by the first transistor T1. Thus, the states of the free-layer 123 the MTJ layer 120 could be controlled/switched by the first transistor T1.

Figure 3D:
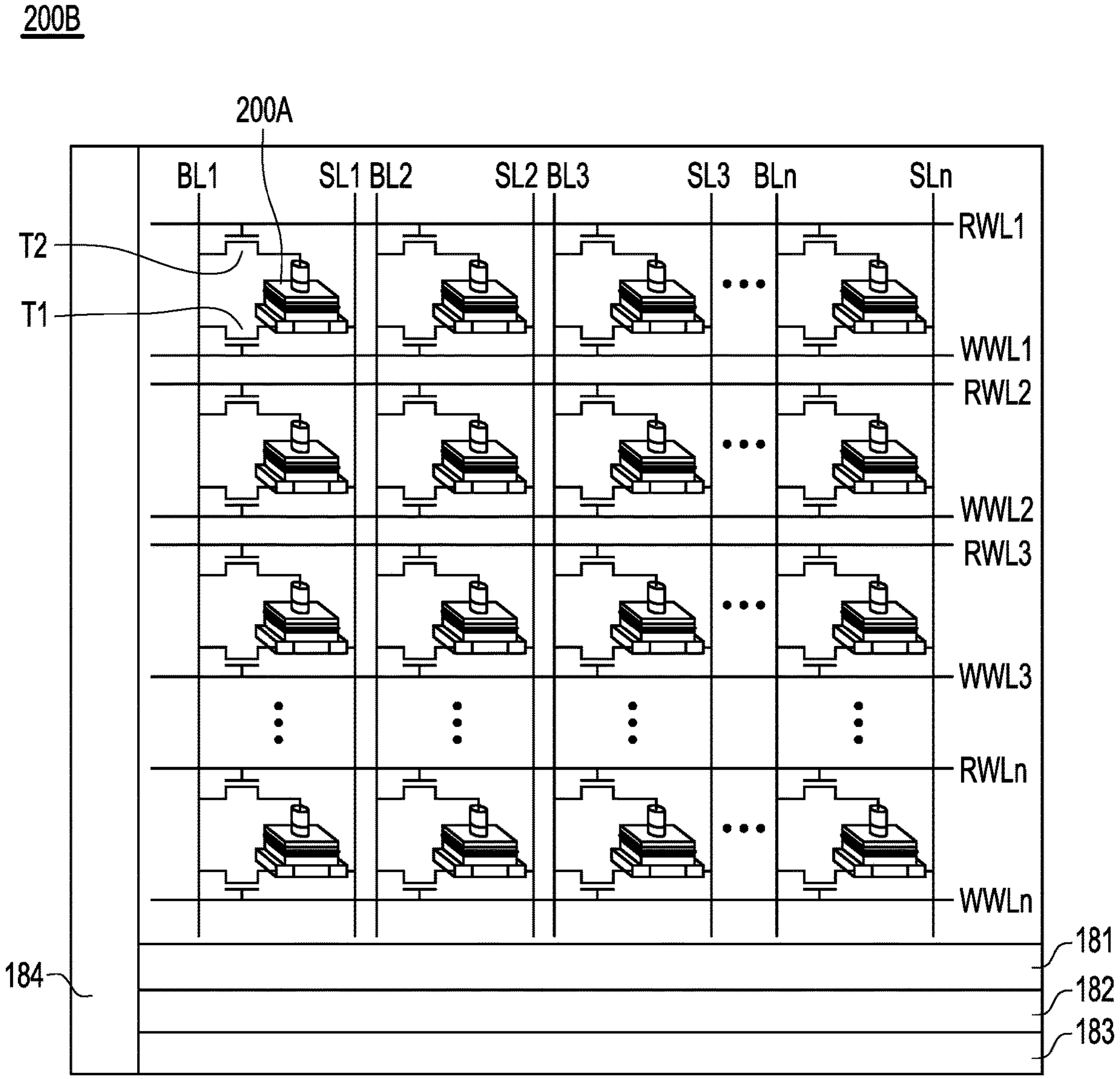
FIGS. 3D to 3E illustrate schematic diagrams of an array structure of a magnetic memory structure according to an embodiment of the present disclosure.

Please refer to FIG. 3D. FIG. 3D is a memory array 200B formed by the memory cells with magnetic memory structure 200A, as shown in FIG. 3A. The structure of the memory array 200B is similar to the structure of the memory array 100B shown in FIG. 1D, thus the similar features are not repeated here. The difference is the following. In the memory array 200B, the memory cell is the magnetic memory structure 200A, and the first transistor is connected to the first conductive portion 141 of the conductive layer 140.

Figure 3E:
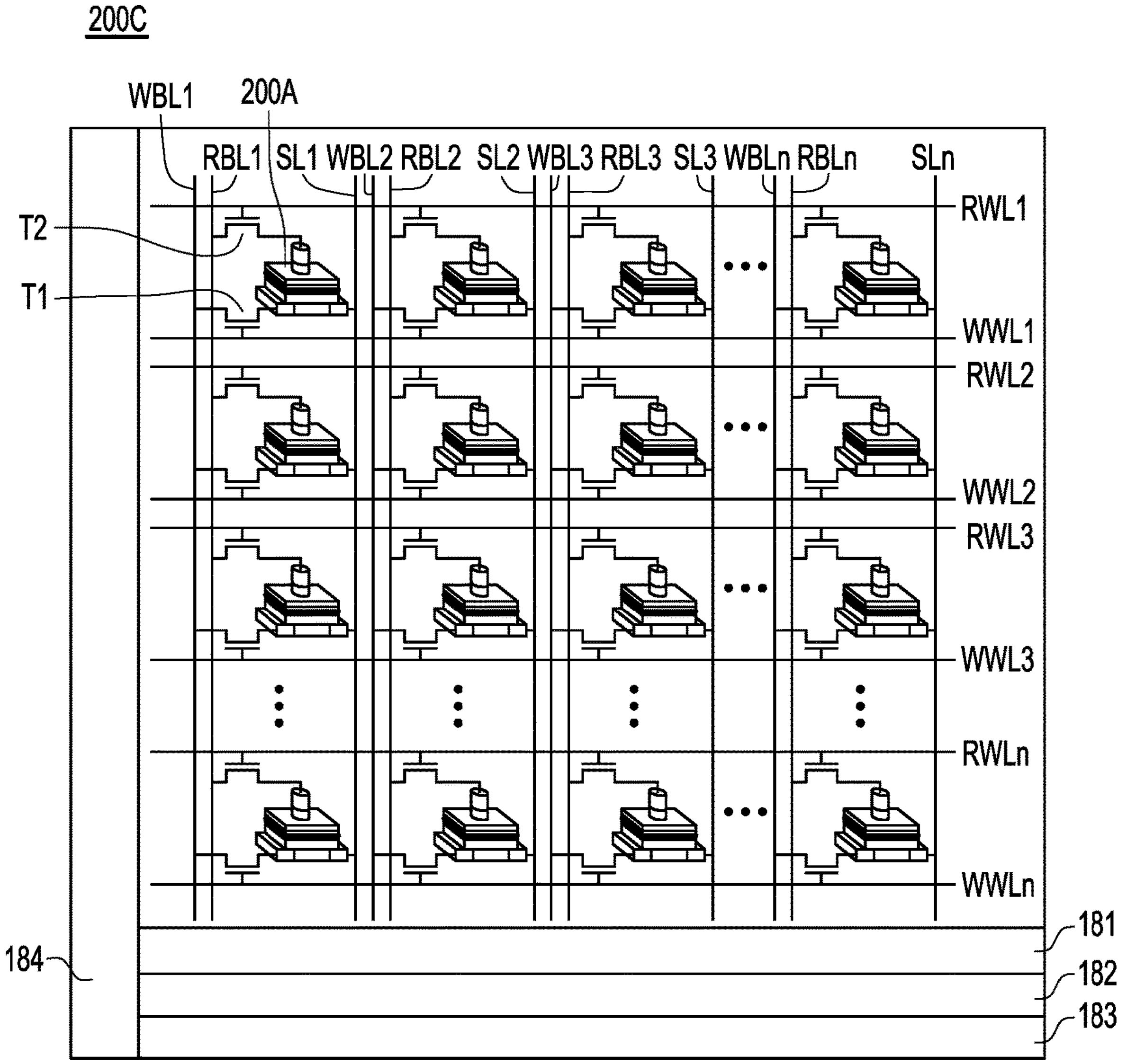

Please refer to FIG. 3E. FIG. 3E is a memory array 200C formed by the memory cells with magnetic memory structure 200A, as shown in FIG. 3A. The structure of the memory array 200C is similar to the structure of the memory array 100C shown in FIG. 1E, thus the similar features are not repeated here. The difference is the following. In the memory array 200C, the memory cell is the magnetic memory structure 200A, and the first transistor is connected to the first conductive portion 141 of the conductive layer 140.

By replacing the memory cell of the memory array 200B and 200C from the magnetic memory structure 100A to magnetic memory structure 200A, the conductive layer 140 in the magnetic memory structure 200A could increase the electric conductivity of the whole of the second heavy-metal layer 133 and the conductive layer 140, and thus it could decease the driving voltage for the electric current passing through the second heavy-metal layer 133.

Figure 4A:
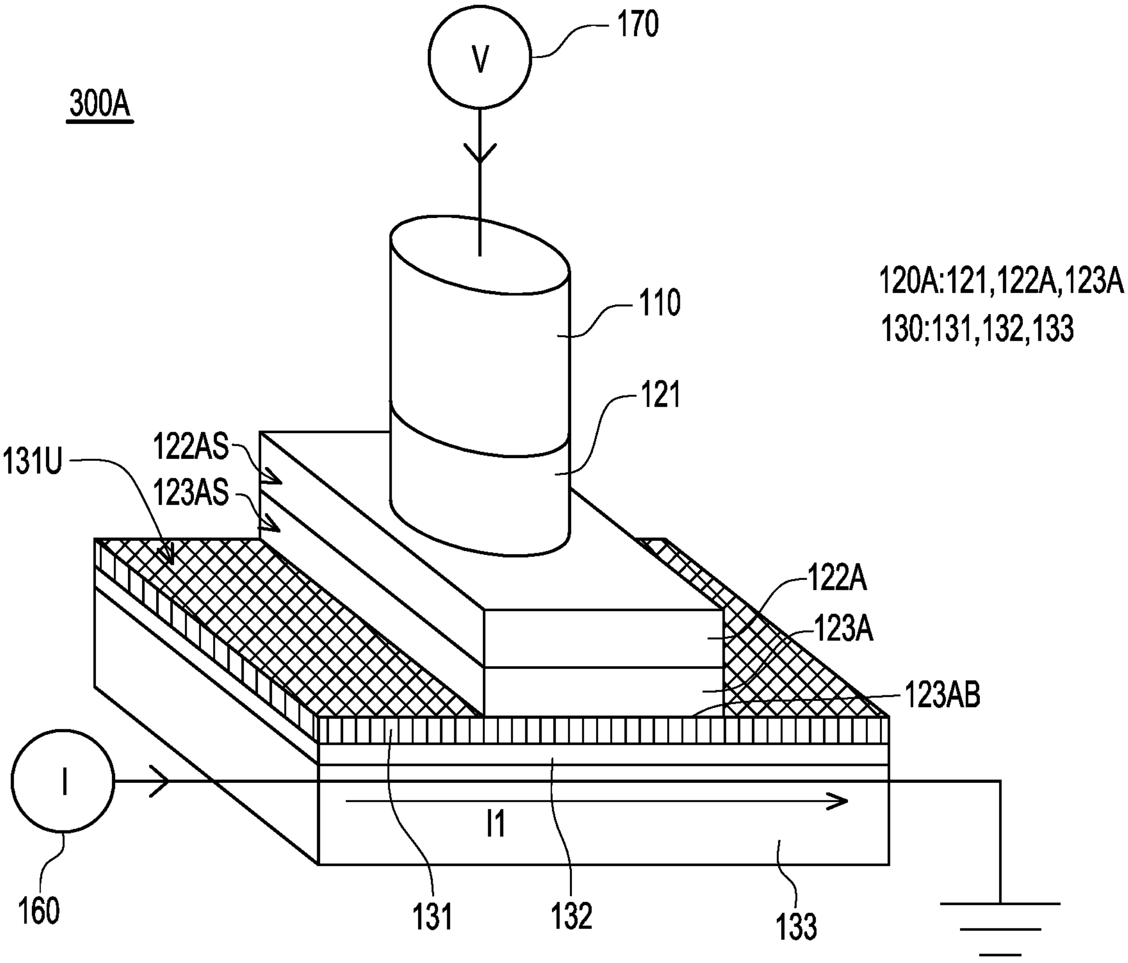
FIGS. 4A to 4C illustrate schematic diagrams of a magnetic memory structure according to an embodiment of the present disclosure.
Figure 4B:
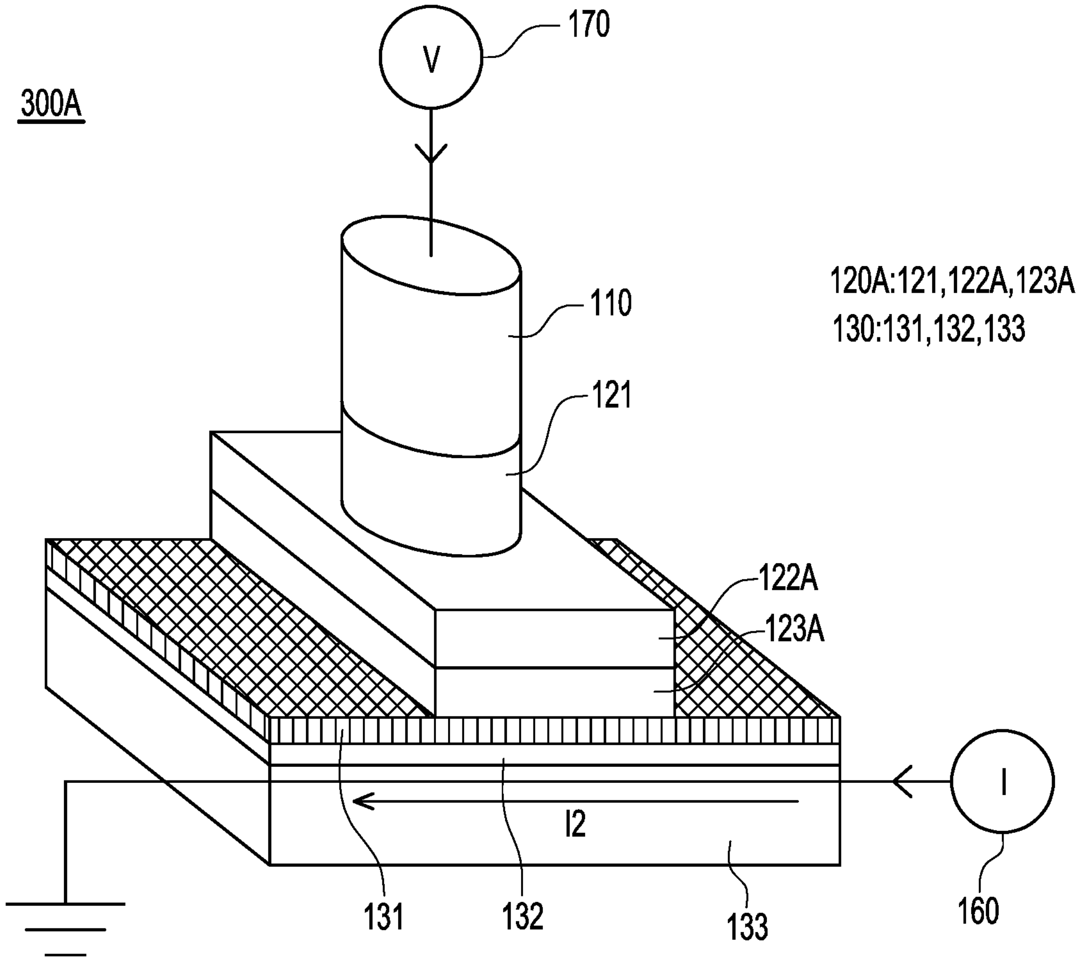

Referring to FIGS. 4A and 4B. FIGS. 4A and 4B illustrate schematic diagrams of a magnetic memory structure 300A according to an embodiment of the present disclosure. The magnetic memory structure 300A is similar to the magnetic memory structure 100A shown in FIGS. 1A and 1B, thus the similar features are not repeated here. The difference is the following. In FIGS. 4A, and 4B, the MTJ layer 120A includes a pinned-layer 121, a barrier-layer 122A and a free-layer 123A. A lateral surface 122AS of the barrier-layer 122A, a lateral surface 123AS of the free-layer 123A are aligned with each other. However, an area of a bottom surface 123AB of the free-layer 123A is smaller than an area of a layer of the heavy-metal layer 130 adjacent to the free-layer 123, which is the first heavy-metal layer 131. In other words, a lateral surface 130S of the heavy-metal layers 130, including the first heavy-metal layer 131, the oxide layer 132, and the second heavy-metal layer 133, extends from the lateral surface 122AS of the barrier-layer 122A and the lateral surface 123AS of the free-layer 123A, which is different from the magnetic memory structure 100A, as shown in FIG. 1A. Also, as shown in FIG. 4A, a bottom surface 123AB of the free-layer 123A is entirely located at a top surface 131U of a layer of the heavy-metal layer 130 adjacent to the free-layer 123, which is the first heavy-metal layer 131.

Since the first heavy-metal layer 131 is made of a material different from that of the barrier-layer 122 and the free-layer 123, the first heavy-metal layer 131 could serve as an etching stop layer for obtaining accurate thicknesses of the barrier-layer 122 and/or the free-layer 123. To be an etching stop layer, the top surface 131U of the first heavy-metal layer 131 is larger than the bottom surface 123AB of the free-layer 123.

By reducing the area of the barrier-layer 122A and the free-layer 123A of the MTJ layer 120A, the size of the MTJ layer 120A is reduced.

Figure 4C:
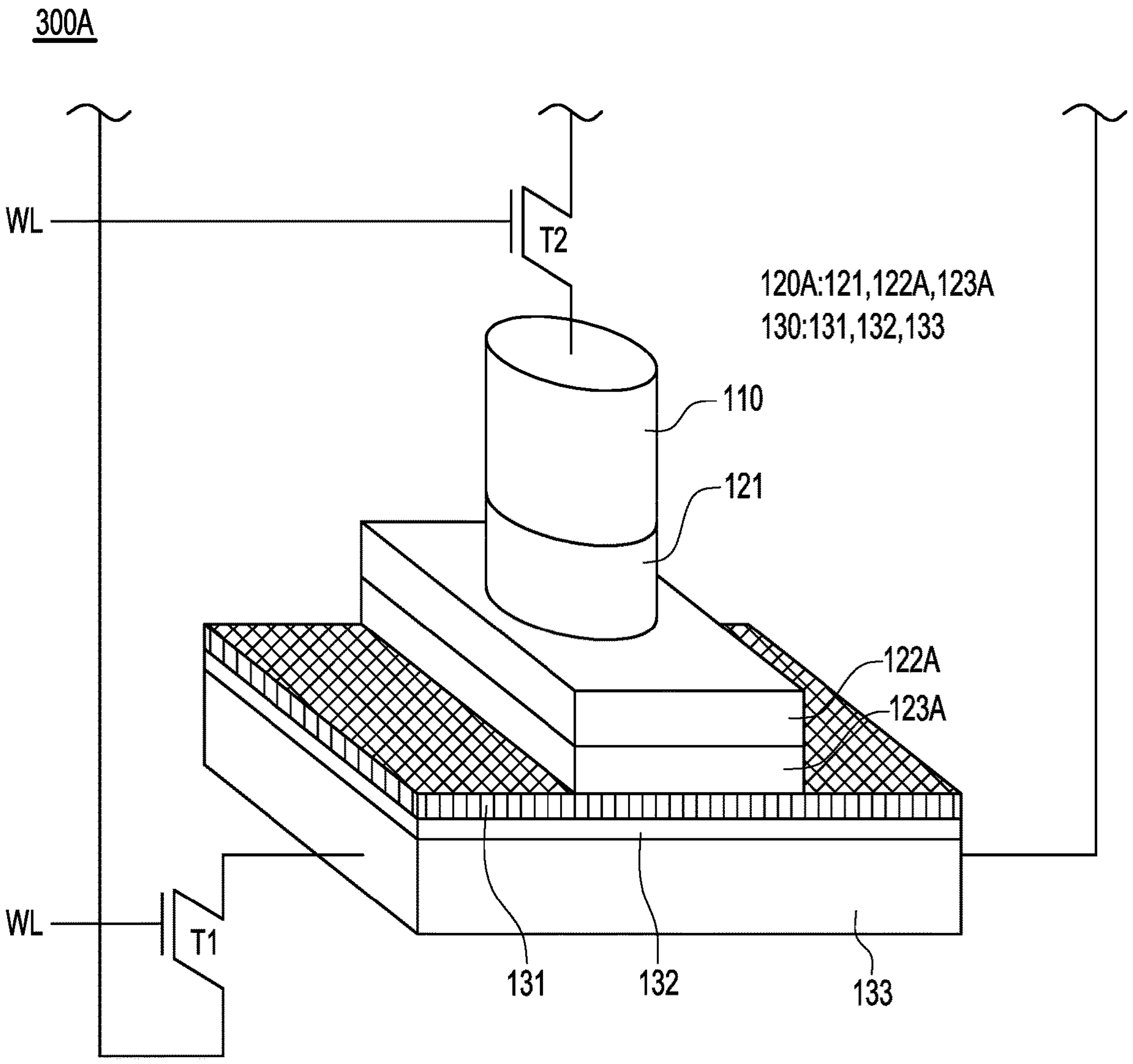

Please refer to FIG. 4C. FIG. 4C is similar to FIG. 1C, thus the similar features are not repeated here. The difference is the following. As illustrated in FIG. 4C, the magnetic memory structure 100A shown in FIG. 1C is replaced by the magnetic memory structure 200A.

Figure 4D:
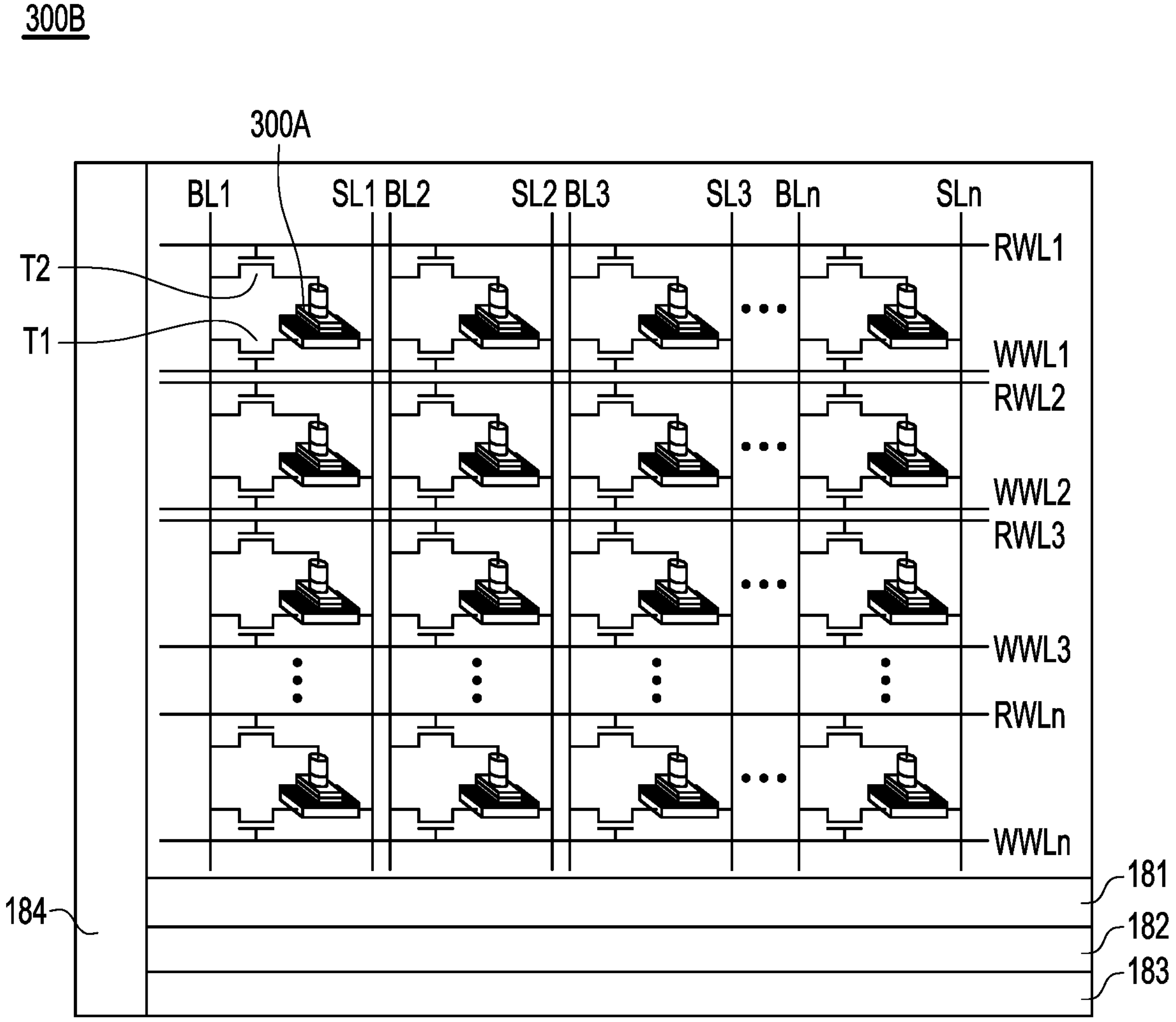
FIGS. 4D to 4E illustrate schematic diagrams of an array structure of a magnetic memory structure according to an embodiment of the present disclosure.
Figure 4E:
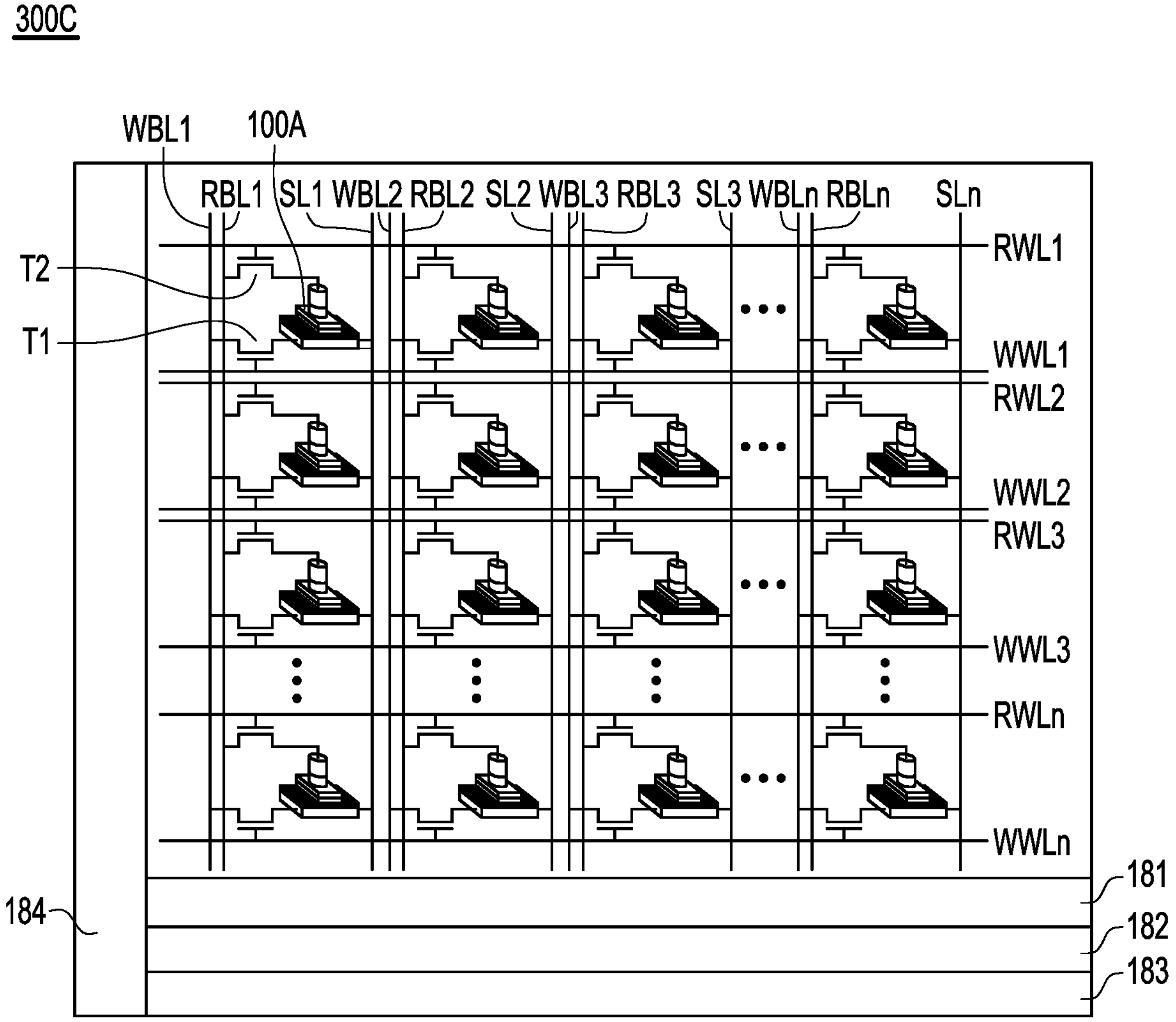

Please refer to FIGS. 4D and 4E. FIGS. 4D and 4E are a memory array 300B and a memory array 300C formed by the memory cells with magnetic memory structure 300A, as shown in FIG. 4A.

By replacing the memory cell of the memory array 300B and 300C from the magnetic memory structure 100A to magnetic memory structure 300A, since the areas of the barrier-layer 122A and the free-layer 123A of the MTJ layer 120A are reduced, the size of the MTJ layer 120A is reduced. Thus, the memory array 300B and 300C may contain more memory cells.

Figure 5A:
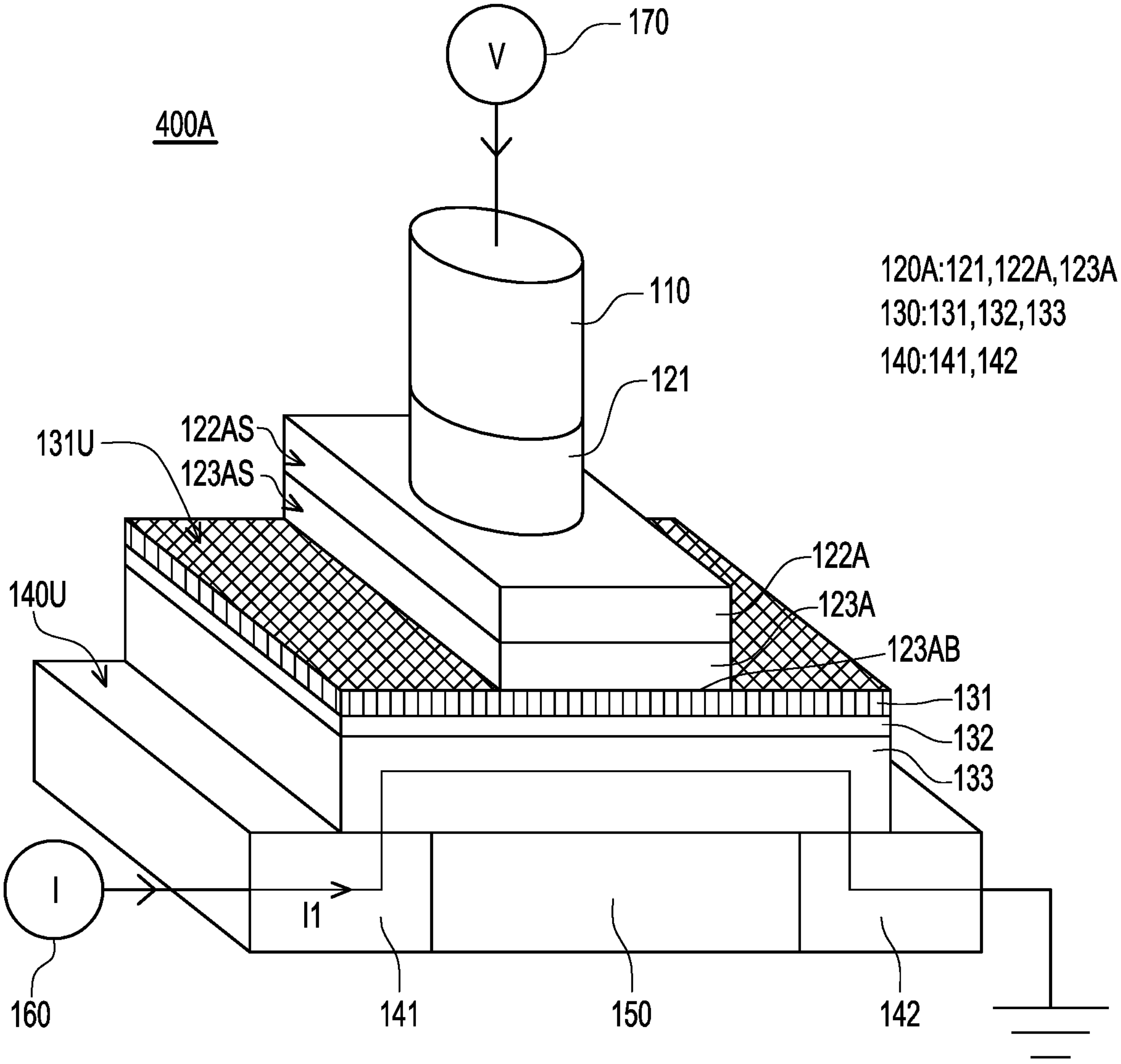
FIGS. 5A to 5C illustrate schematic diagrams of a magnetic memory structure according to an embodiment of the present disclosure.
Figure 5B:
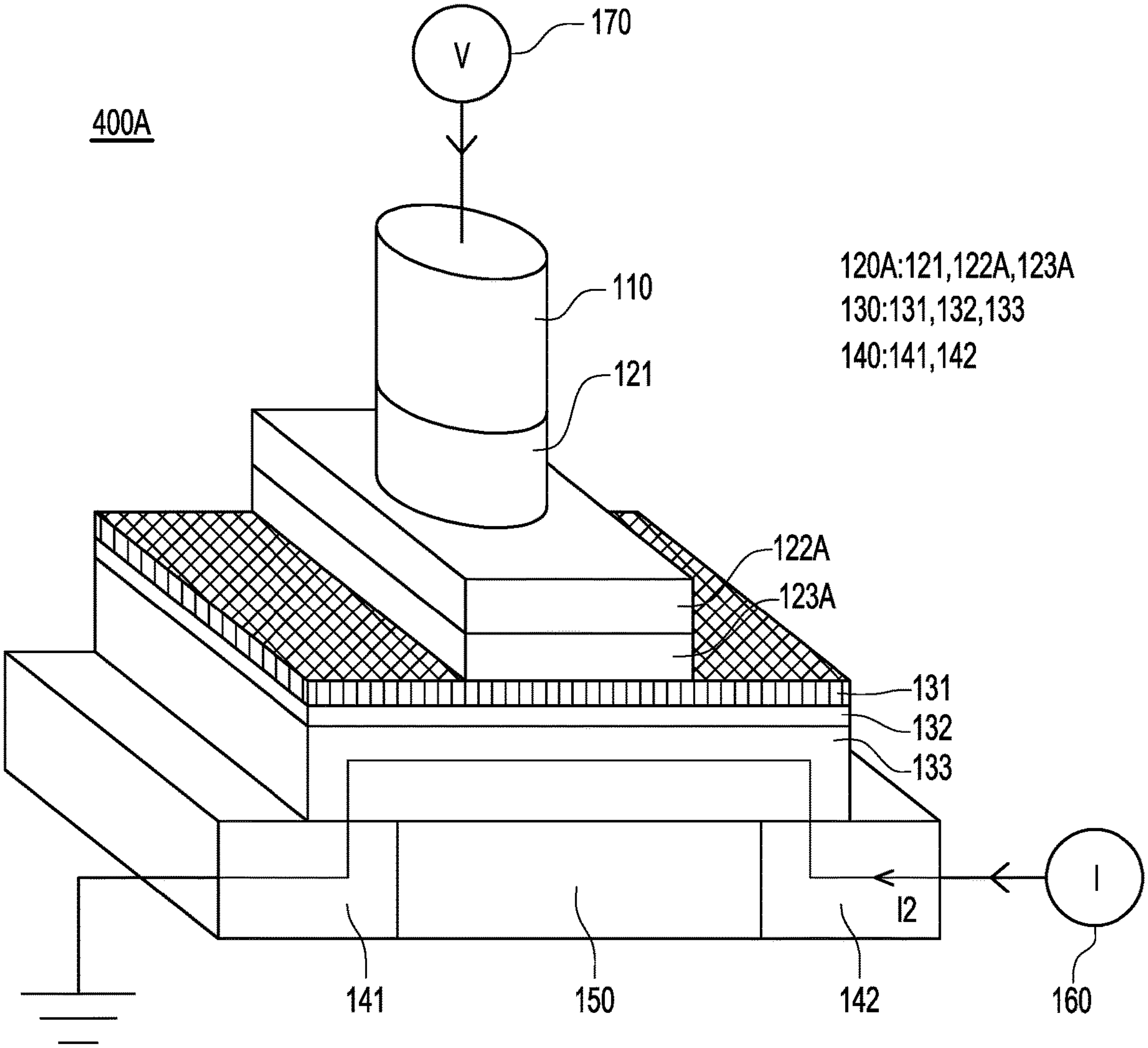

Referring to FIGS. 5A and 5B. FIGS. 5A and 5B illustrate schematic diagrams of a magnetic memory structure 400A according to an embodiment of the present disclosure. The magnetic memory structure 400A is similar to the magnetic memory structure 300A shown in FIGS. 4A and 4B, thus the similar features are not repeated here. In FIGS. 5A and 5B, the magnetic memory structure 400A further includes a conductive layer 140 being formed below the second heavy-metal layer 133. In comparison with the structure without the conductive layer 140, such as the magnetic memory structure 300A shown in FIGS. 4A and 4B, the conductive layer 140 in the present embodiment could increase the electric conductivity of the whole of the second heavy-metal layer 133 and the conductive layer 140, and thus it could decease the driving voltage for the electric current I1 of FIG. 4A and the electric current I2 of FIG. 4B.

Figure 5C:
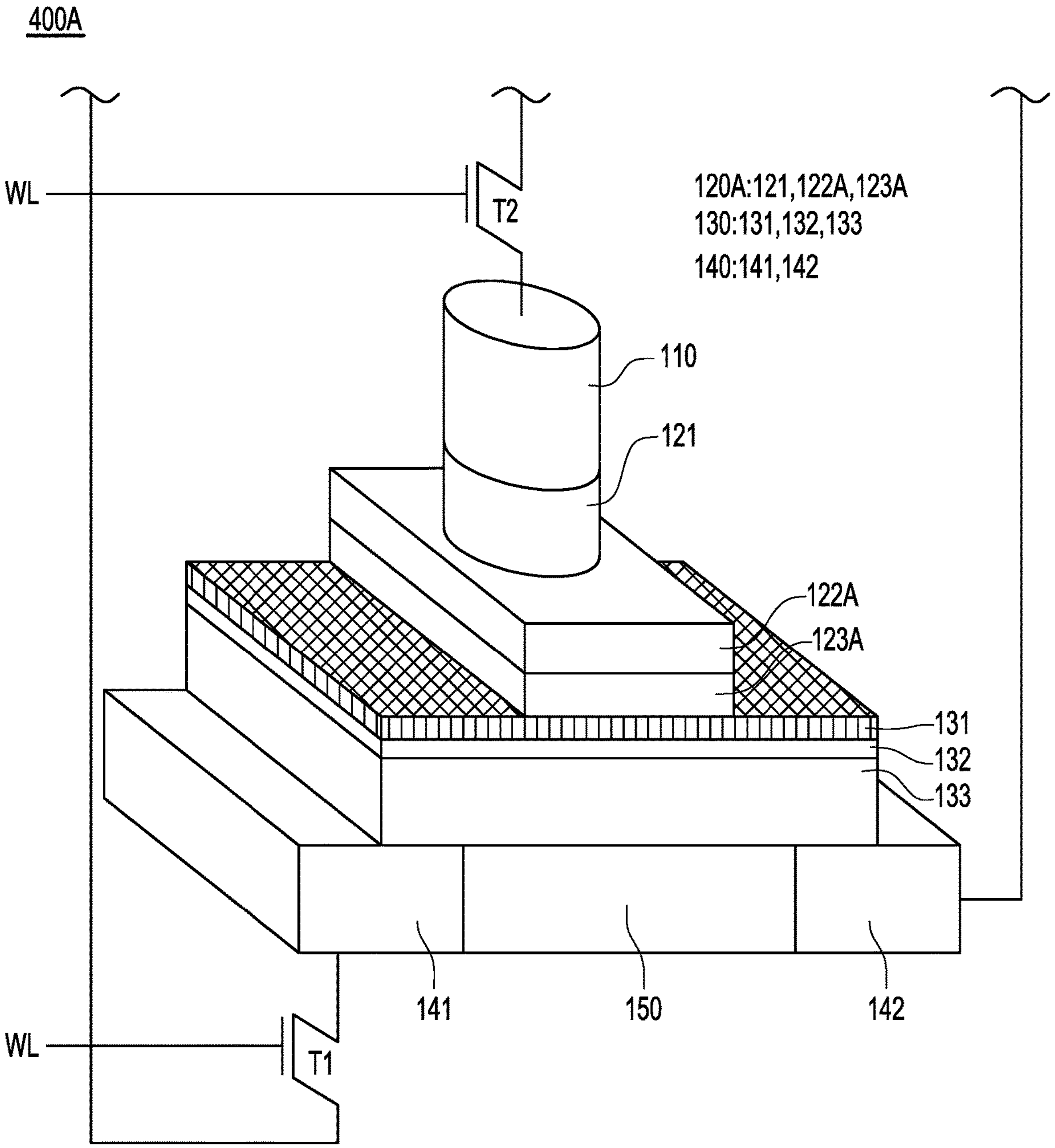

Please refer to FIG. 5C. FIG. 5C is similar to FIG. 4C, thus the similar features are not repeated here. The difference is the following. As illustrated in FIG. 5C, the first transistor T1 is connected to the first conductive portion 141. The passage of the electric current I1 or I2 to conductive layer 140 is controlled by the first transistor T1. Thus, the states of the free-layer 123A the MTJ layer 120A could be controlled/switched by the first transistor T1.

Figure 5D:
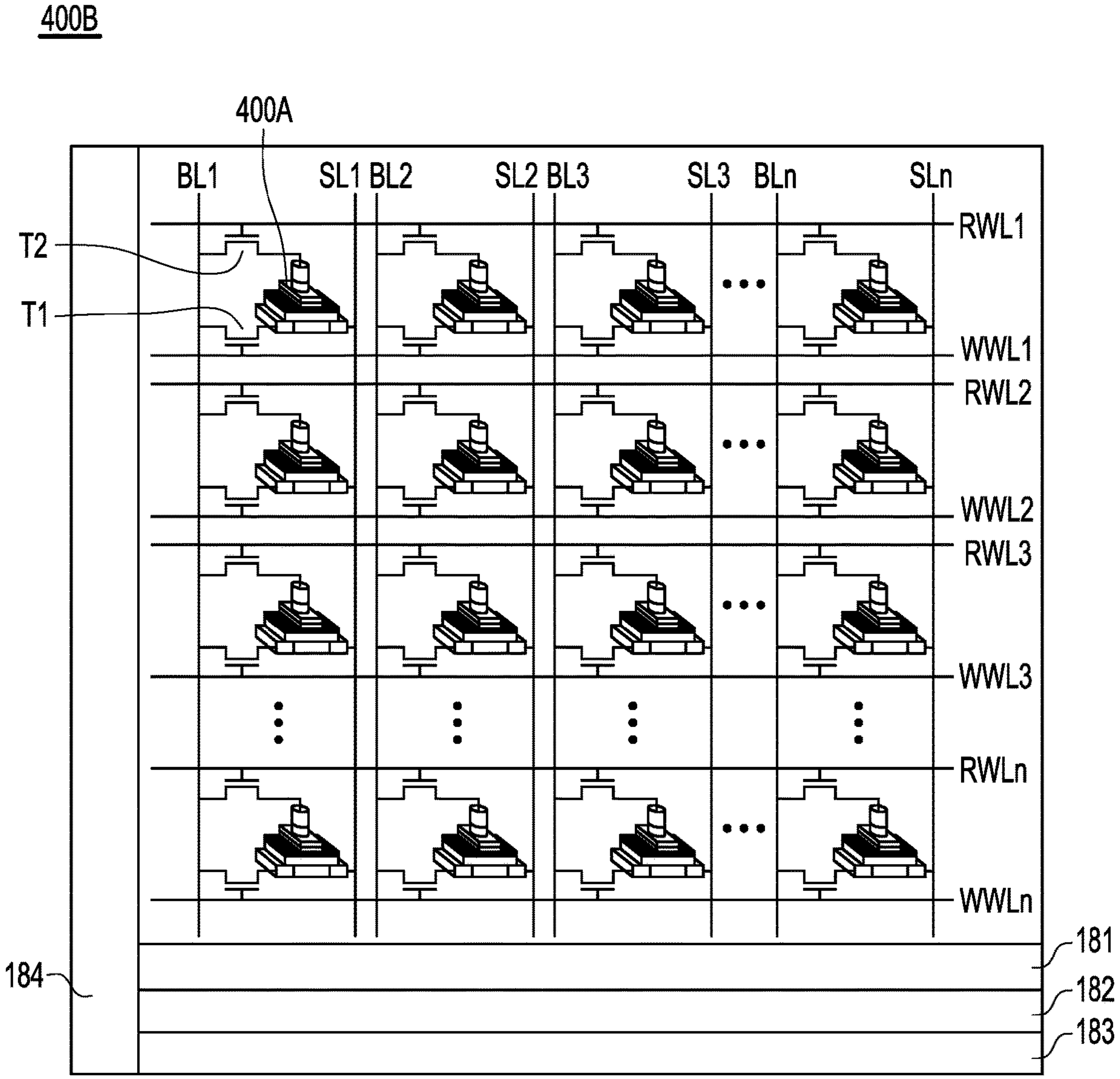
FIGS. 5D to 5E illustrate schematic diagrams of an array structure of a magnetic memory structure according to an embodiment of the present disclosure.
Figure 5E:
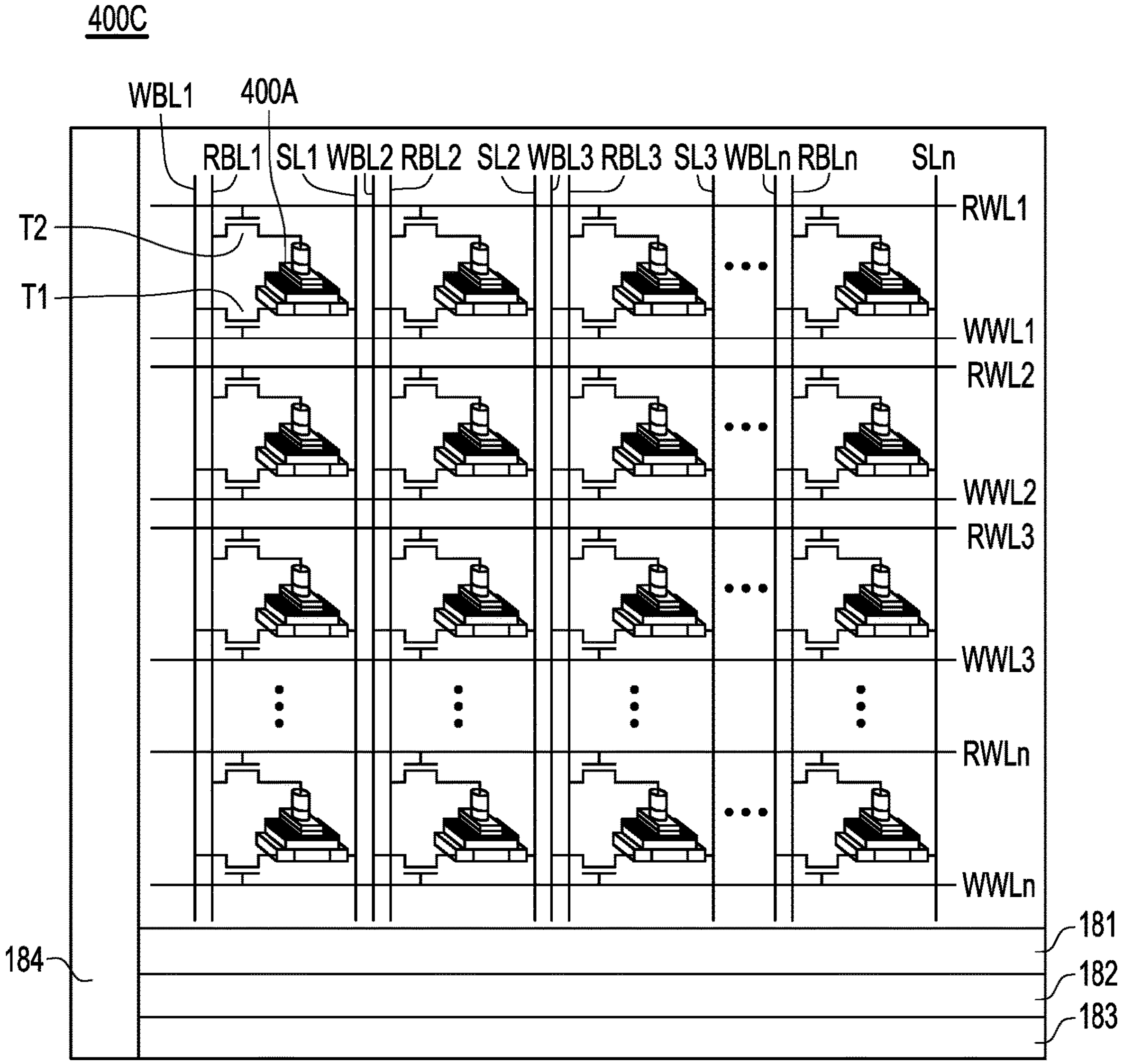

Please refer to FIGS. 5D and 5E. FIGS. 5D and 5E are a memory array 400B and a memory array 400C formed by the memory cells with magnetic memory structure 400A, as shown in FIG. 5A.

By replacing the memory cell of the memory array 400B and 400C from the magnetic memory structure 100A to magnetic memory structure 400A, since the areas of the barrier-layer 122A and the free-layer 123A of the MTJ layer 120A are reduced, the size of the MTJ layer 120A is reduced. Thus, the memory array 400B and 400C may contain more memory cells.

Figure 6A:
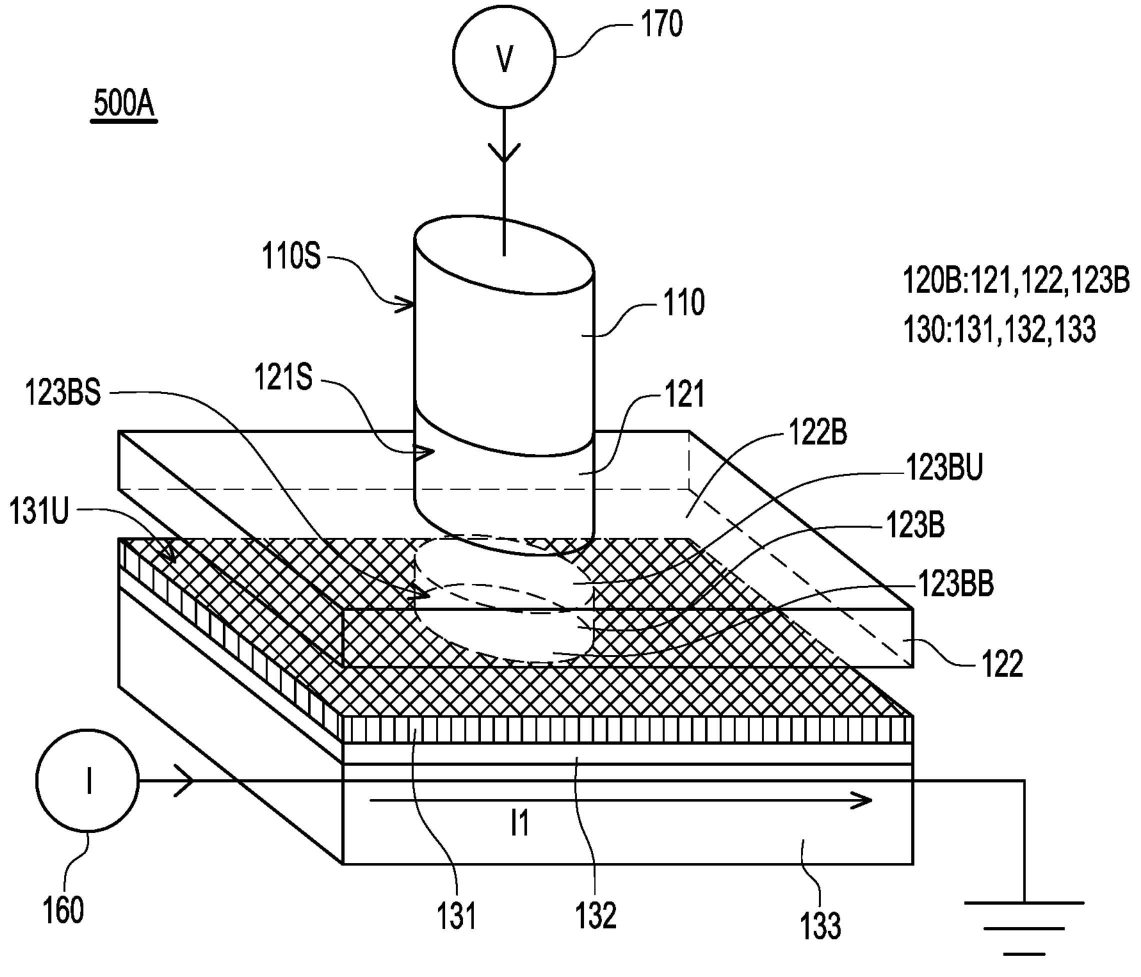
FIGS. 6A to 6C illustrate schematic diagrams of a magnetic memory structure according to an embodiment of the present disclosure.
Figure 6B:
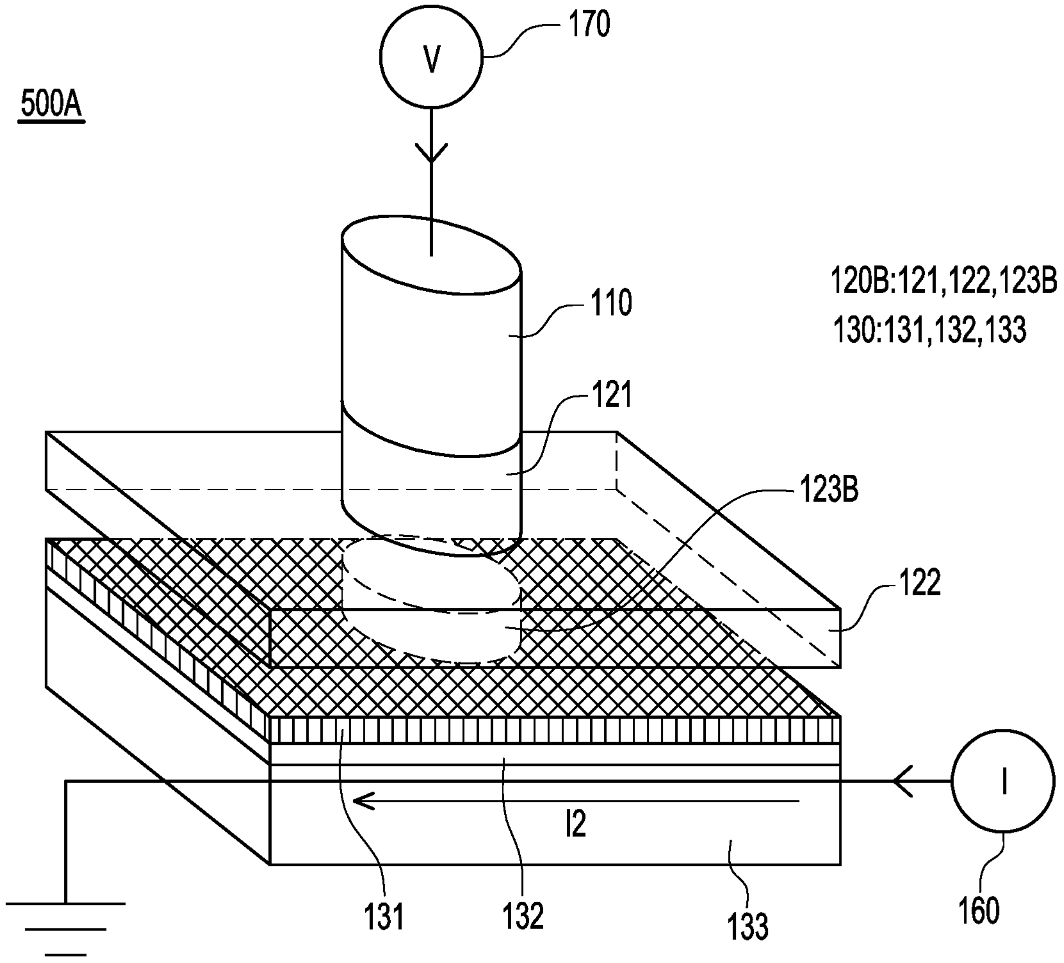

Referring to FIGS. 6A and 6B. FIGS. 6A and 6B illustrate schematic diagrams of a magnetic memory structure 500A according to an embodiment of the present disclosure. The magnetic memory structure 500A is similar to the magnetic memory structure 100A shown in FIGS. 1A and 1B, thus the similar features are not repeated here. The difference is the following. In FIGS. 6A, and 6B, the MTJ layer 120B includes a pinned-layer 121, a barrier-layer 122 and a free-layer 123B. An area of a top surface 123BU of the free-layer 123B is smaller than an area of a bottom surface 122B of the barrier-layer 122, and an area of a bottom surface 123BB of the free-layer 123B is smaller than an area of a top surface 131U of a layer of the heavy-metal layer 130 adjacent to the free-layer 123, which is the first heavy-metal layer 131. In other words, the free-layer 123B is shrink compare to the free-layer 112 shown in FIG. 1A. A lateral surface 123BS of the free-layer 123B shrinks from a lateral surface 122S of the barrier-layer 123B. Also, as shown in FIG. 6A, an area of a top surface 123BU of the free-layer 123B is entirely located at an area of a bottom surface 122BB of the barrier-layer 122, and an area of a bottom surface 123BB of the free-layer 123B is entirely located at an area of a top surface 131U of a layer of the heavy-metal layer 130 adjacent to the free-layer 123B, which is the first heavy-metal layer 131.

Since the first heavy-metal layer 131 is made of a material different from that of the free-layer 123, the first heavy-metal layer 131 could serve as an etching stop layer for obtaining accurate thicknesses of the free-layer 123. To be an etching stop layer, the top surface 131U of the first heavy-metal layer 131 is larger than the bottom surface 123BB of the free-layer 123B.

By reducing the area of the free-layer 123B of the MTJ layer 120B, the size of the MTJ layer 120B is reduced.

Figure 6C:
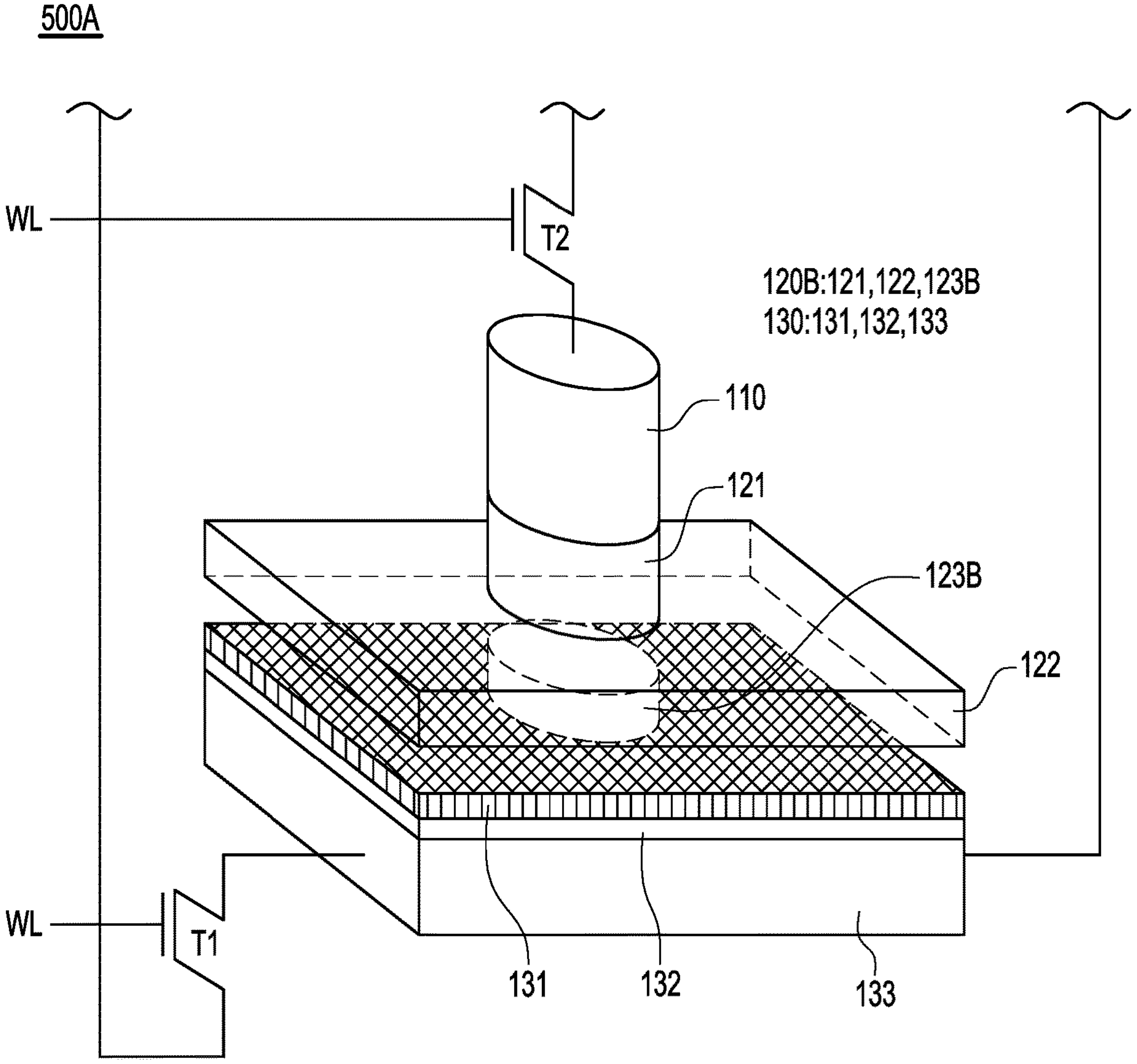

Please refer to FIG. 6C. FIG. 6C is similar to FIG. 1C, thus the similar features are not repeated here. The difference is the following. As illustrated in FIG. 6C, the magnetic memory structure 100A shown in FIG. 1C is replaced by the magnetic memory structure 500A.

Figure 6D:
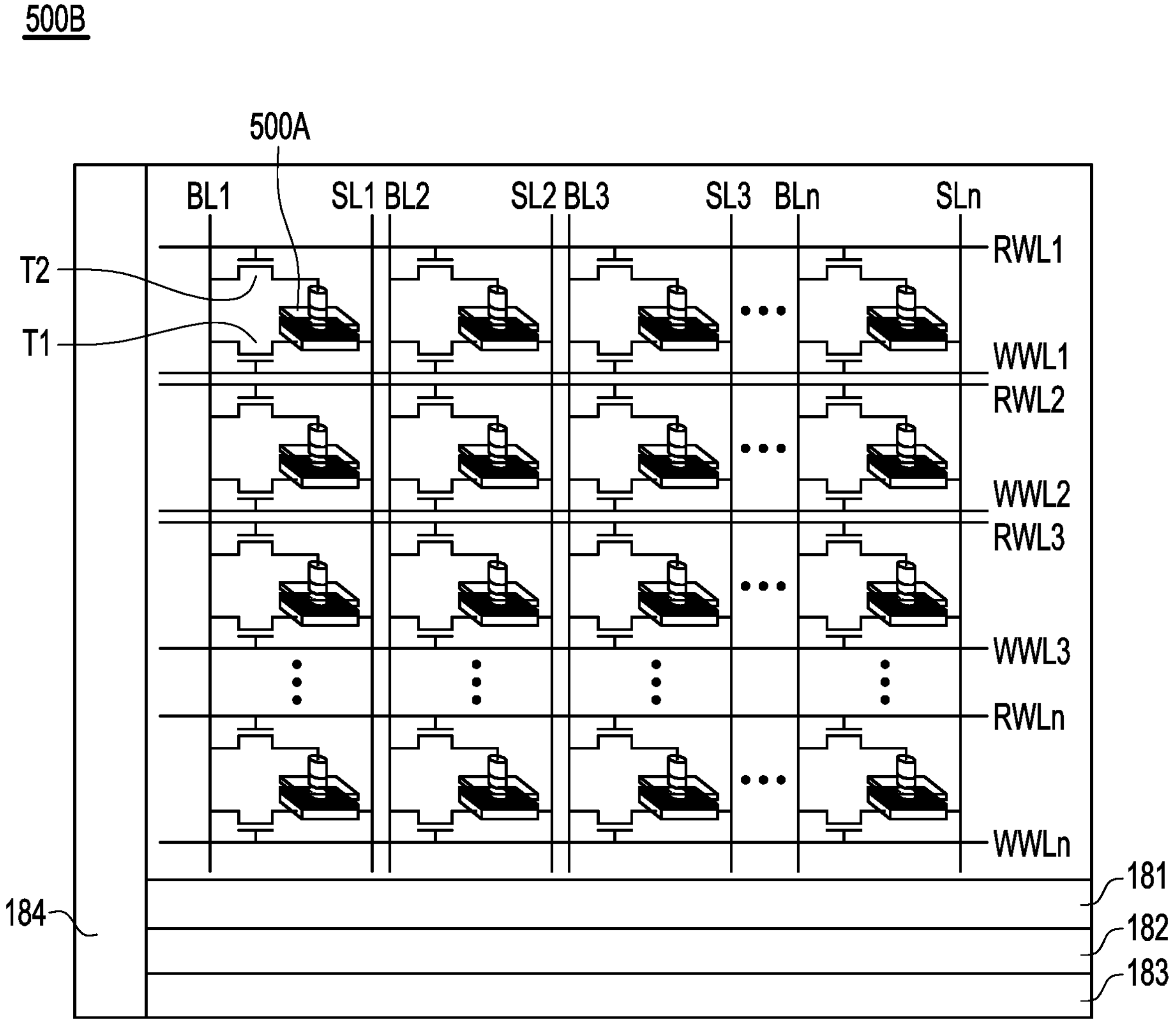
FIGS. 6D to 6E illustrate schematic diagrams of an array structure of a magnetic memory structure according to an embodiment of the present disclosure.
Figure 6E:
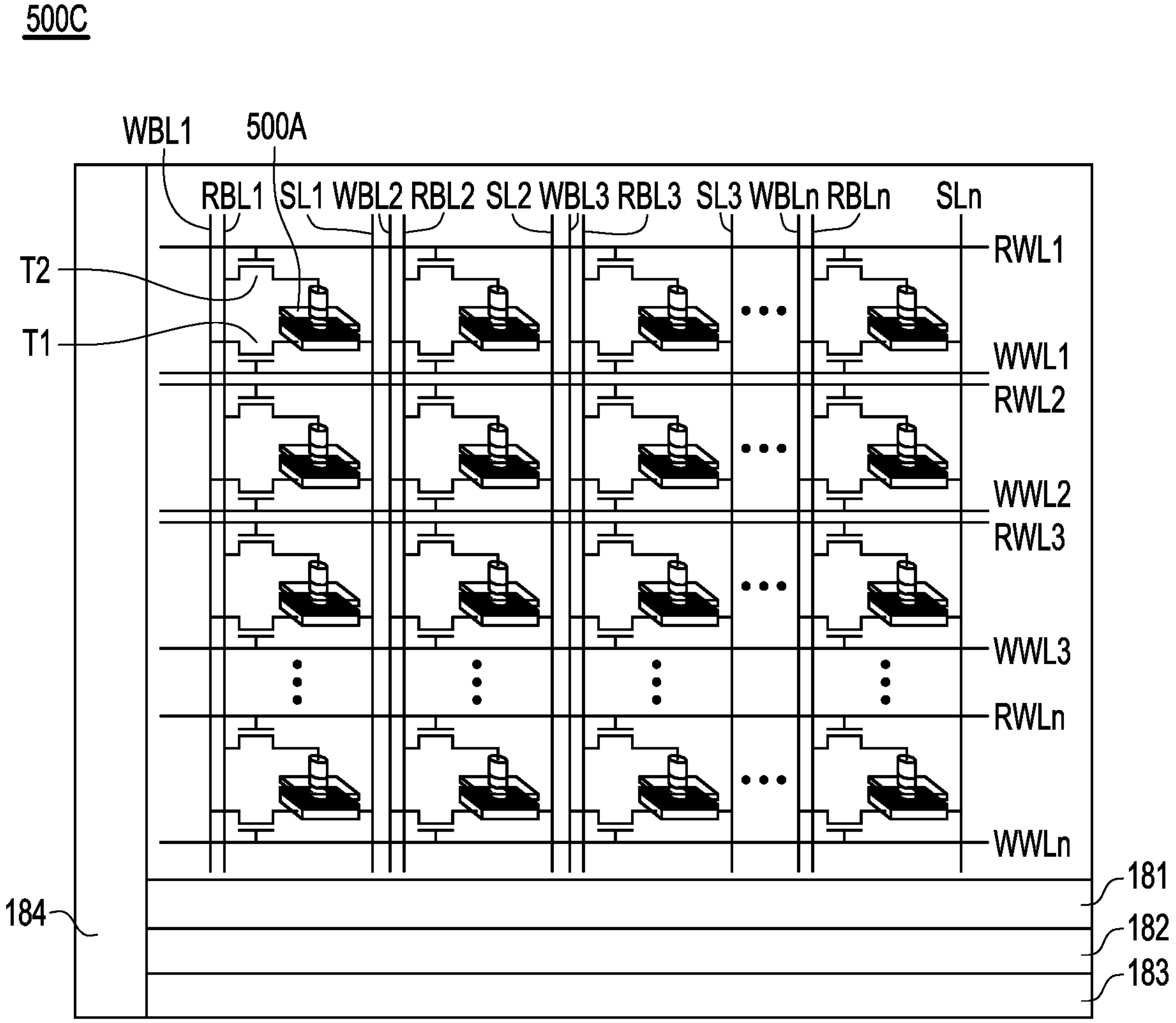

Please refer to FIGS. 6D and 6E. FIGS. 6D and 6E are a memory array 500B and a memory array 500C formed by the memory cells with magnetic memory structure 500A, as shown in FIG. 6A.

By replacing the memory cell of the memory array 500B and 500C from the magnetic memory structure 100A to magnetic memory structure 500A, since the area of the free-layer 123B of the MTJ layer 120B are reduced, the size of the MTJ layer 120B is reduced. Thus, the memory array 500B and 500C may contain more memory cells.

Figure 7A:
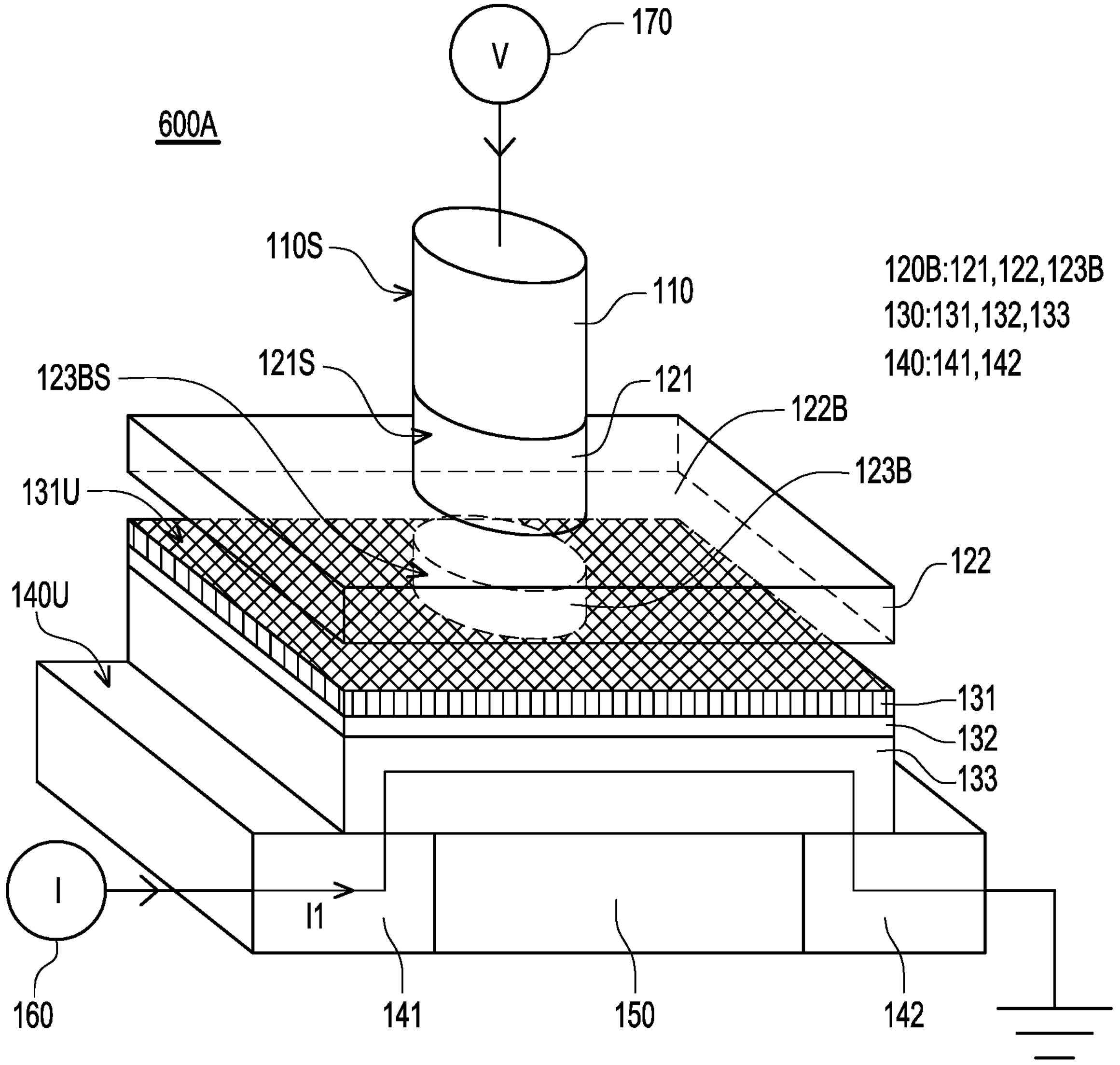
FIGS. 7A to 7C illustrate schematic diagrams of a magnetic memory structure according to an embodiment of the present disclosure.
Figure 7B:
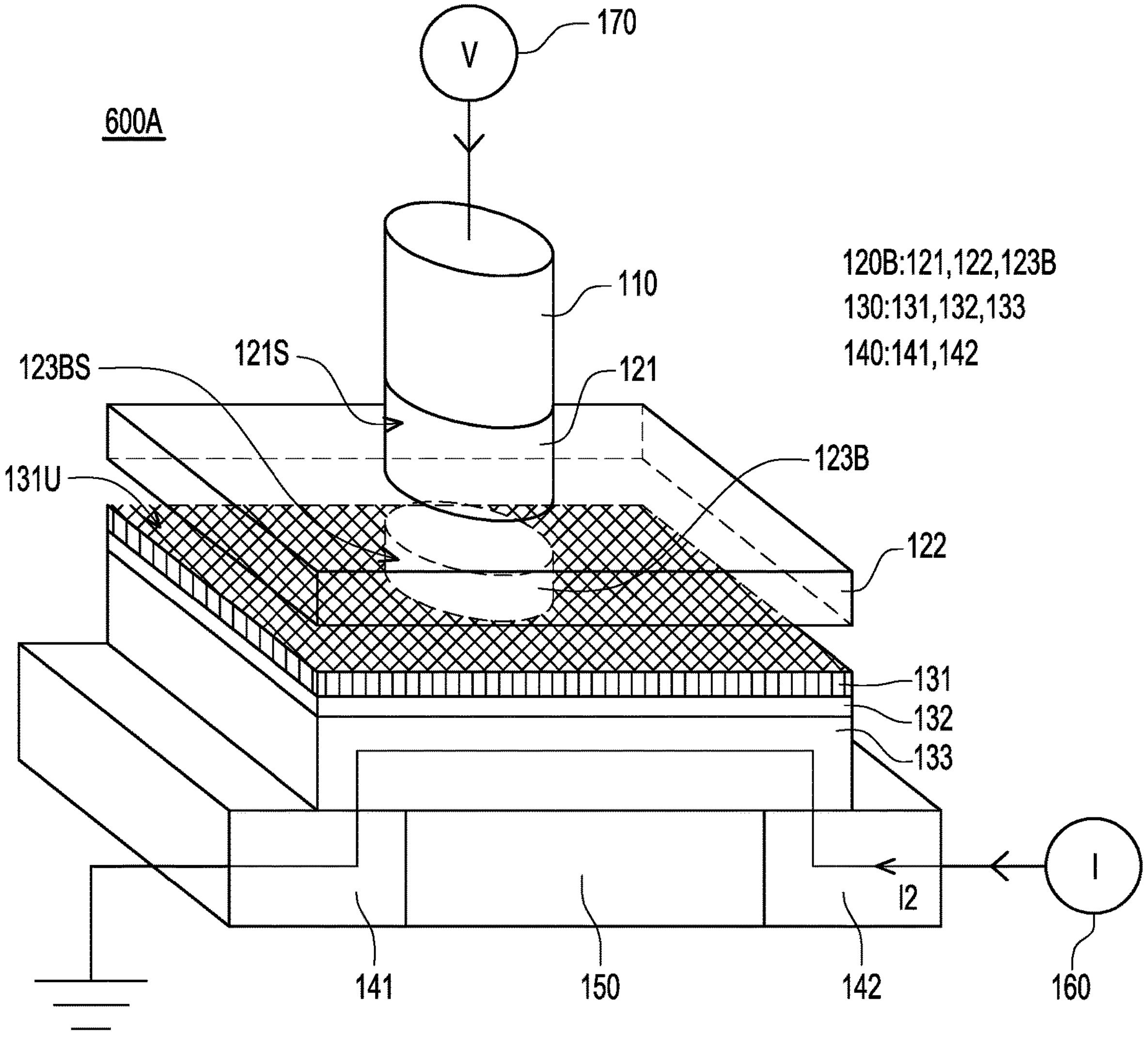

Referring to FIGS. 7A and 7B. FIGS. 7A and 7B illustrate schematic diagrams of a magnetic memory structure 600A according to an embodiment of the present disclosure. The magnetic memory structure 600A is similar to the magnetic memory structure 500A shown in FIGS. 5A and 5B, thus the similar features are not repeated here. In FIGS. 7A and 7B, the magnetic memory structure 600A further includes a conductive layer 140 being formed below the second heavy-metal layer 133. In comparison with the structure without the conductive layer 140, such as the magnetic memory structure 500A shown in FIGS. 6A and 6B, the conductive layer 140 in the present embodiment could increase the electric conductivity of the whole of the second heavy-metal layer 133 and the conductive layer 140, and thus it could decease the driving voltage for the electric current I1 of FIG. 6A and the electric current I2 of FIG. 6B.

Figure 7C:
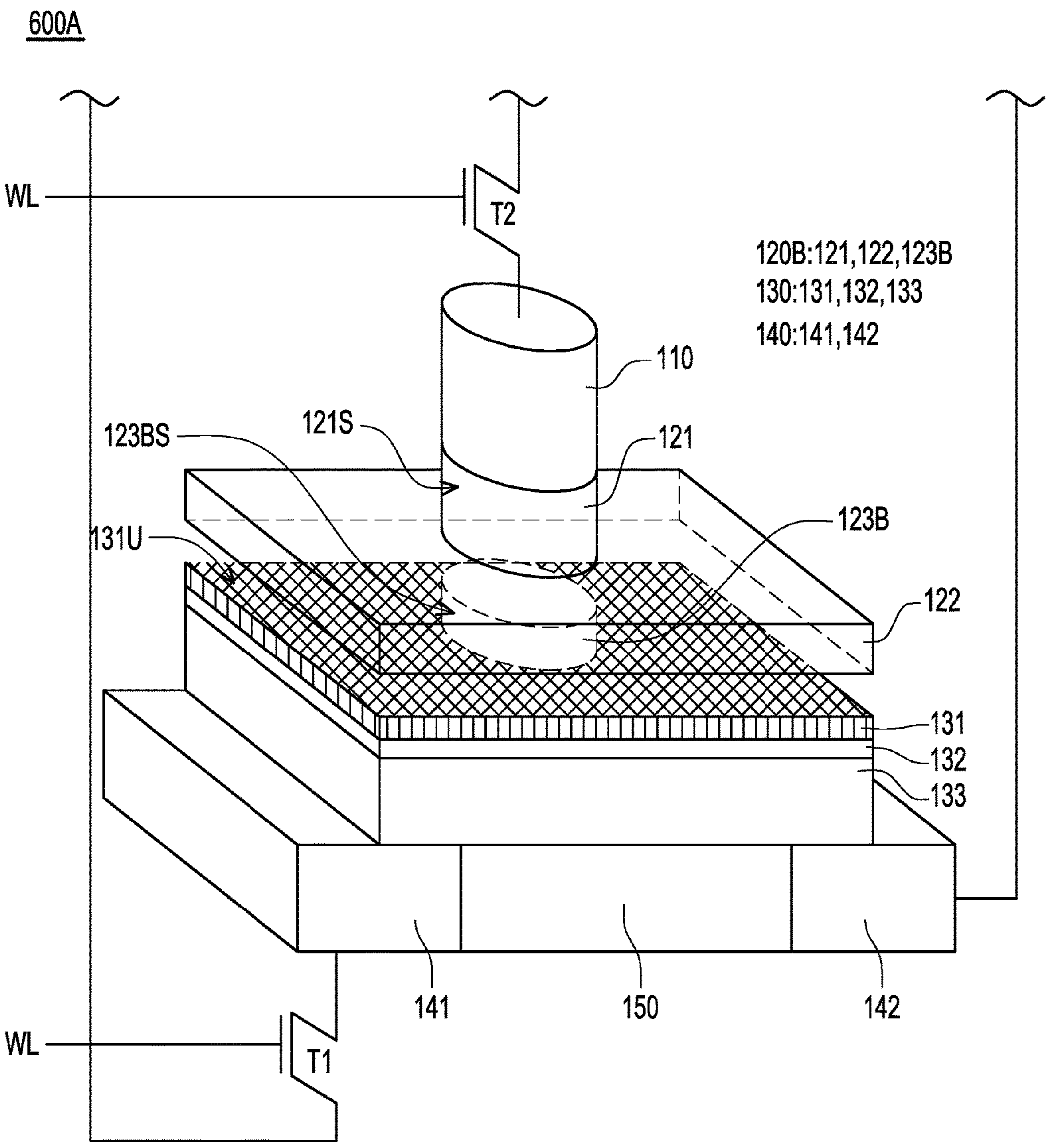

Please refer to FIG. 7C. FIG. 7C is similar to FIG. 6C, thus the similar features are not repeated here. The difference is the following. As illustrated in FIG. 6C, the first transistor T1 is connected to the first conductive portion 141. The passage of the electric current I1 or I2 to conductive layer 140 is controlled by the first transistor T1. Thus, the states of the free-layer 123A the MTJ layer 120A could be controlled/switched by the first transistor T1.

Figure 7D:
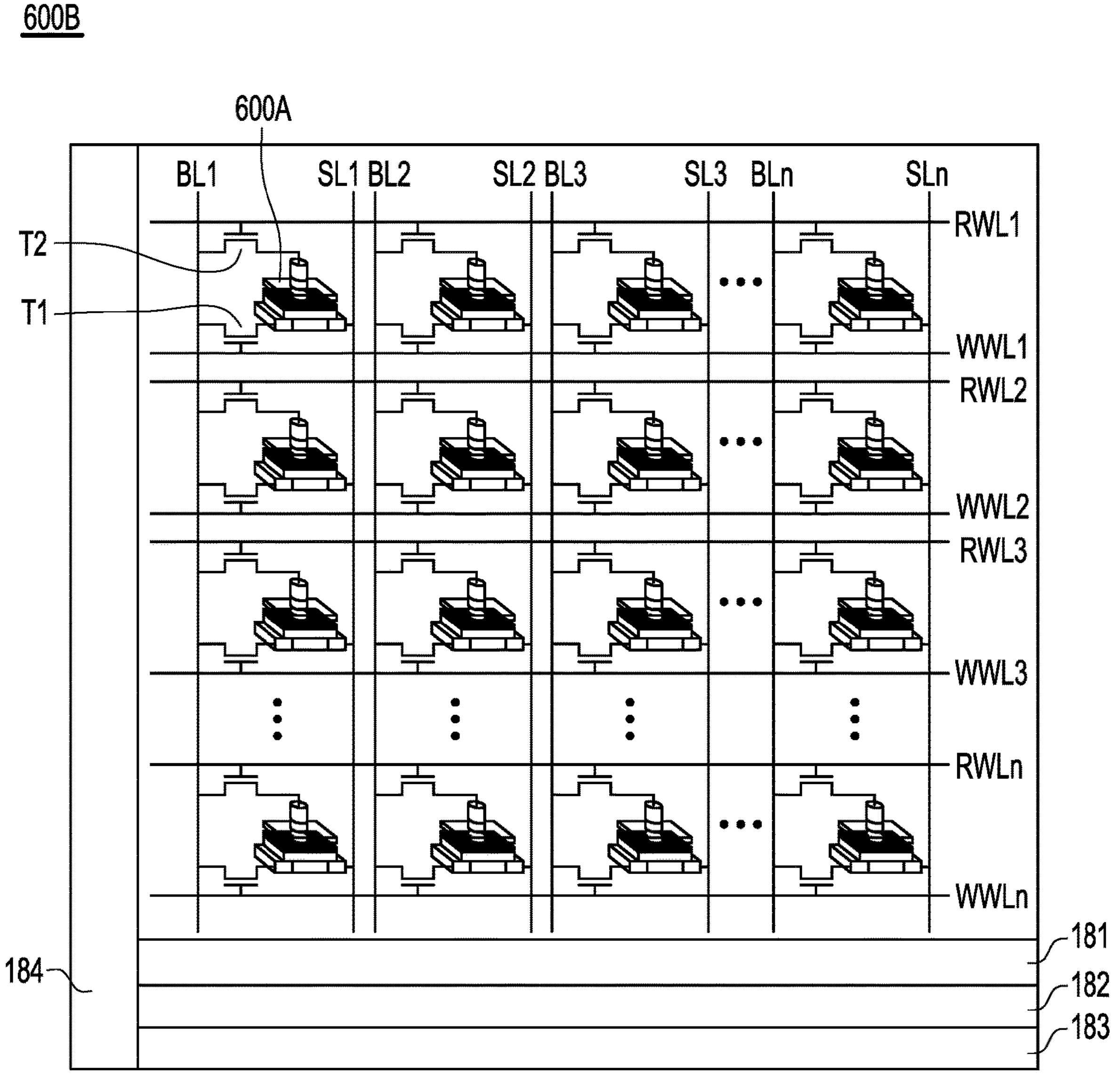
FIGS. 7D to 7E illustrate schematic diagrams of an array structure of a magnetic memory structure according to an embodiment of the present disclosure.
Figure 7E:
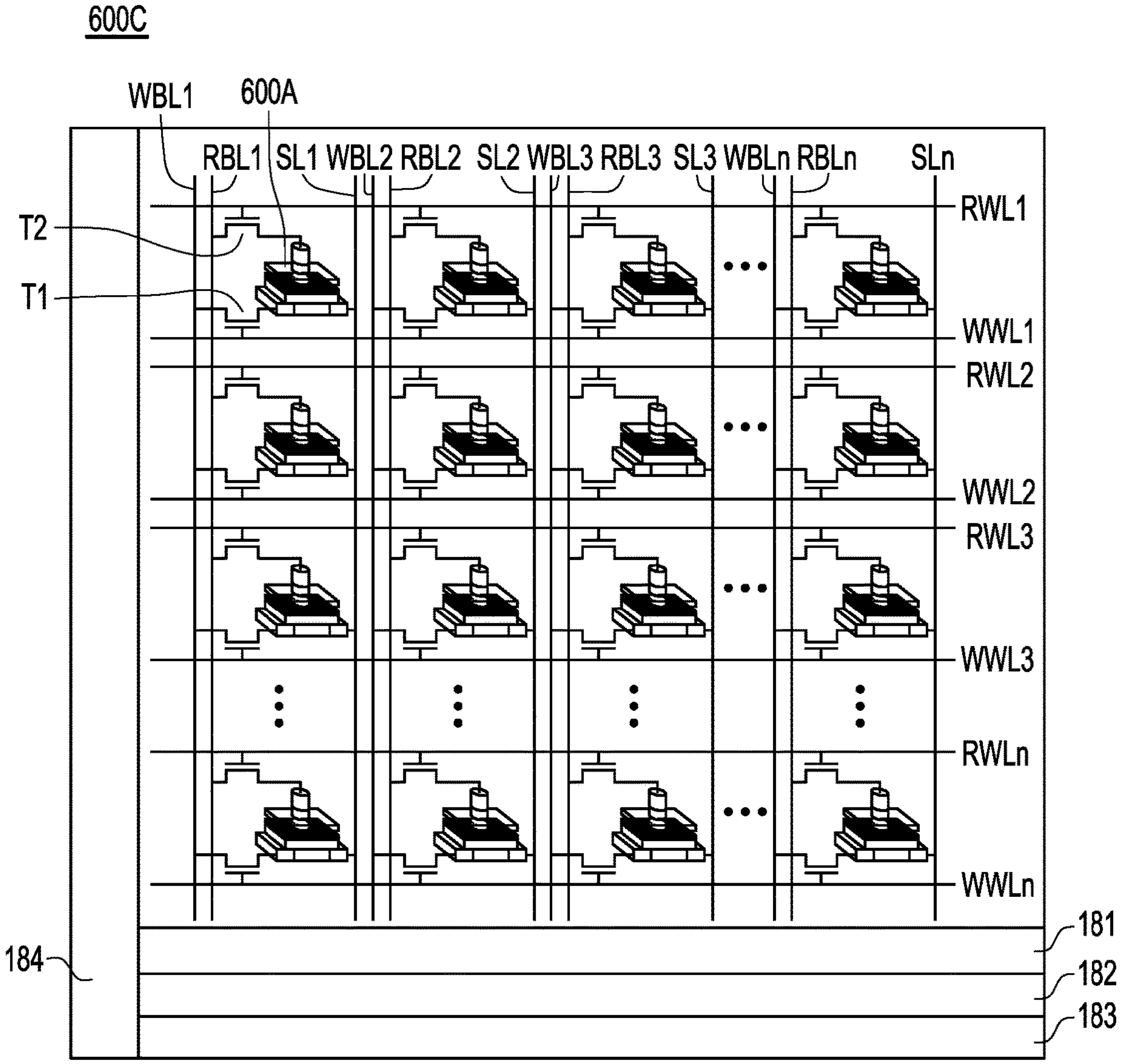

Please refer to FIGS. 7D and 7E. FIGS. 7D and 7E are a memory array 600B and a memory array 600C formed by the memory cells with magnetic memory structure 600A, as shown in FIG. 7A.

By replacing the memory cell of the memory array 600B and 600C from the magnetic memory structure 100A to magnetic memory structure 600A, since the areas of the free-layer 123B of the MTJ layer 120B are reduced, the size of the MTJ layer 120B is reduced. Thus, the memory array 600B and 600C may contain more memory cells.

Figure 8A:
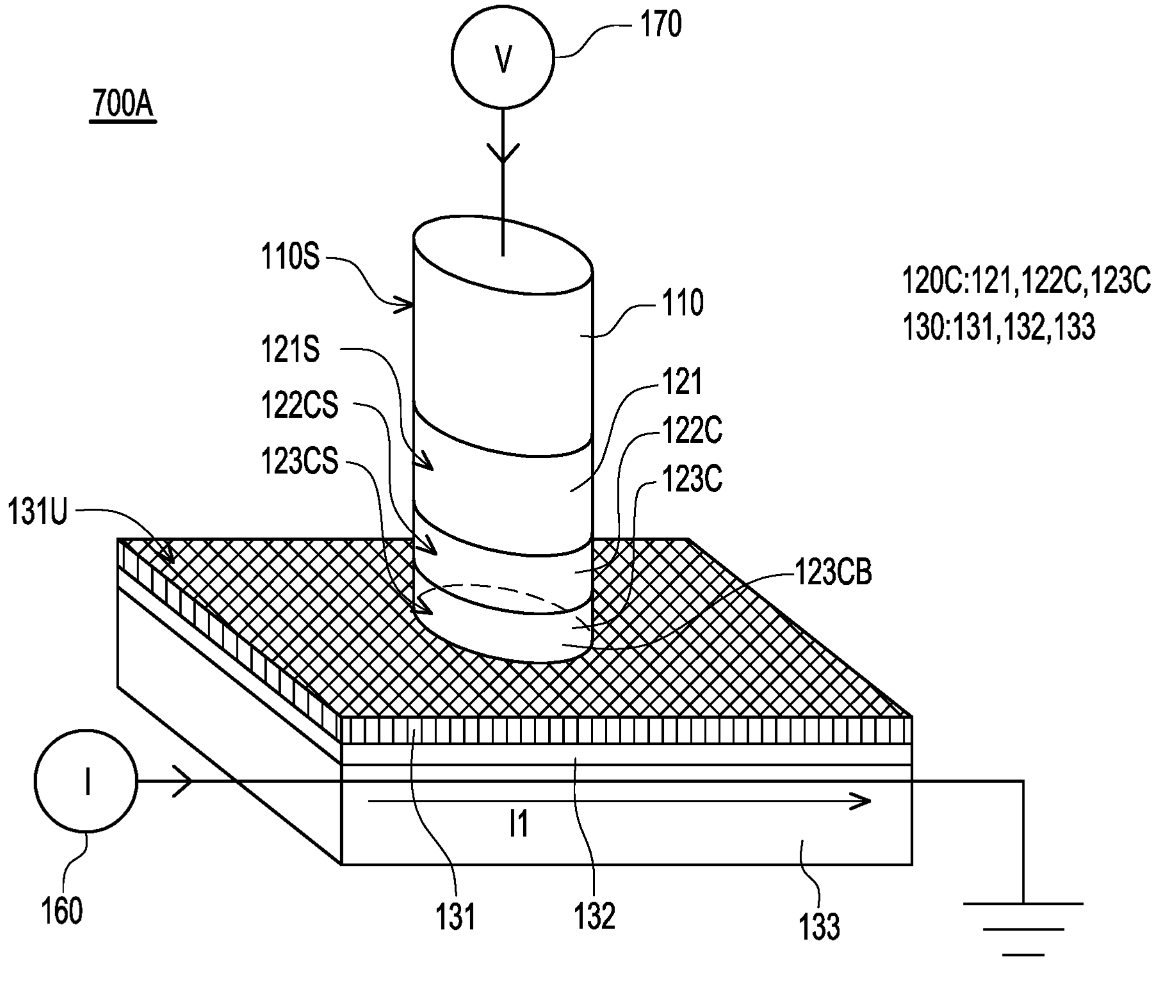
FIGS. 8A to 8C illustrate schematic diagrams of a magnetic memory structure according to an embodiment of the present disclosure.
Figure 8B:
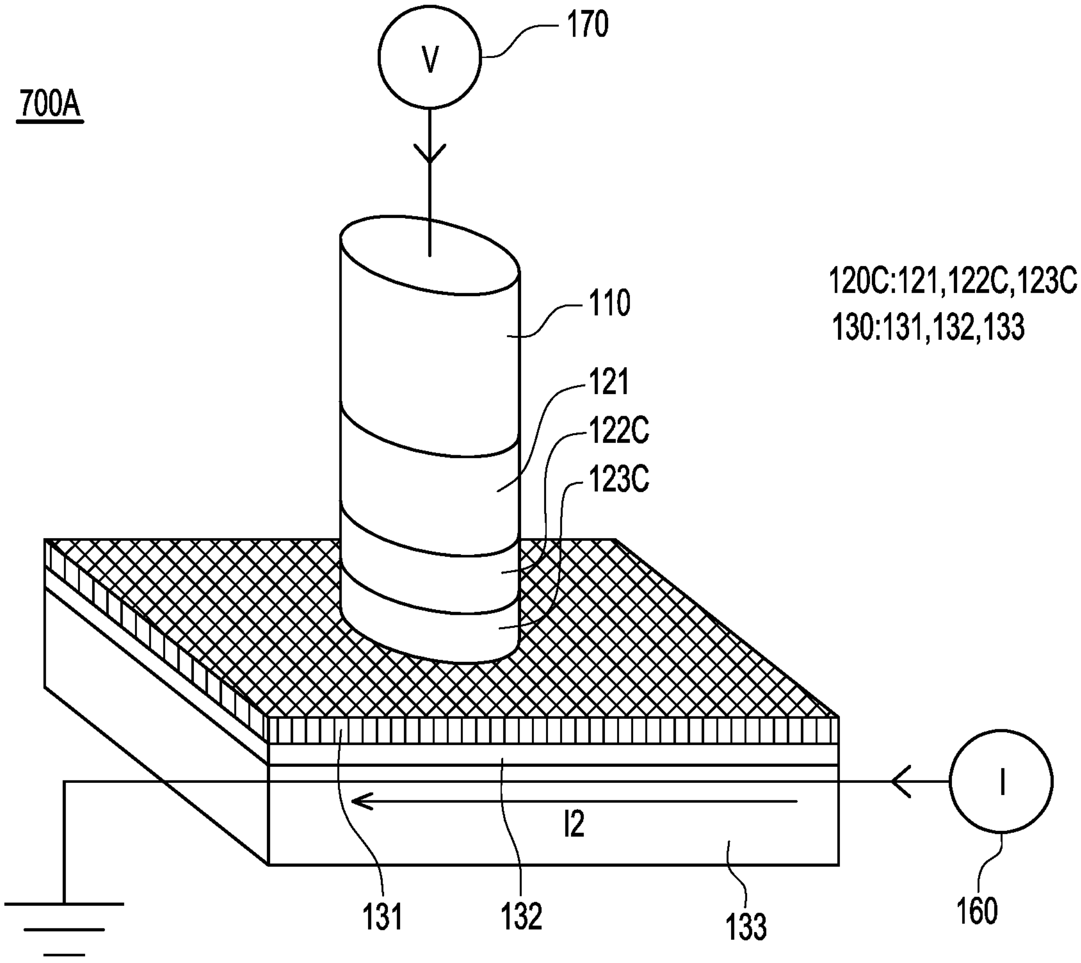

Referring to FIGS. 8A and 8B. FIGS. 8A and 8B illustrate schematic diagrams of a magnetic memory structure 700A according to an embodiment of the present disclosure. The magnetic memory structure 700A is similar to the magnetic memory structure 100A shown in FIGS. 1A and 1B, thus the similar features are not repeated here. The difference is the following. In FIGS. 8A, and 8B, the MTJ layer 120C includes a pinned-layer 121, a barrier-layer 122C and a free-layer 123C. A lateral surface 121S of the pinned-layer 121, a lateral surface 122CS of the barrier-layer 122C, and a lateral surface 123CS of the free-layer 123C are aligned with each other. A lateral surface 130S of the heavy-metal layer 130 extends from a lateral surface 123CS of the free-layer 123C. An area of a heavy-metal layer 130 of the free-layer 123C is smaller than an area of a top surface 131U of a layer of the heavy-metal layer 130 adjacent to the free-layer 123, which is the first heavy-metal layer 131. Also, as shown in FIG. 8A, an area of a heavy-metal layer 130 of the free-layer 123 is entirely located at an area of a top surface 131U of a layer of the heavy-metal layer 130 adjacent to the free-layer 123C, which is the first heavy-metal layer 131.

Since the first heavy-metal layer 131 is made of a material different from that of the pinned-layer 121, the barrier-layer 122C and the free-layer 123C, the first heavy-metal layer 131 could serve as an etching stop layer for obtaining accurate thicknesses of the pinned-layer 121, the barrier-layer 122C and the free-layer 123C. To be an etching stop layer, the top surface 131U of the first heavy-metal layer 131 is larger than the heavy-metal layer 130 of the free-layer 123C. Also, in one etching process, the top electrode 110, the pinned-layer 121, the barrier-layer 122C and the free-layer 123C are etched, by the same mask, to form the lateral surfaces 110S, 121S, 122CS and 123CS, and thus the lateral surfaces 110S, 121S, 122CS and 123CS are substantially aligned with each other.

By reducing the area of the MTJ layer 120C, the size of the MTJ layer 120C is reduced accordingly.

Figure 8C:
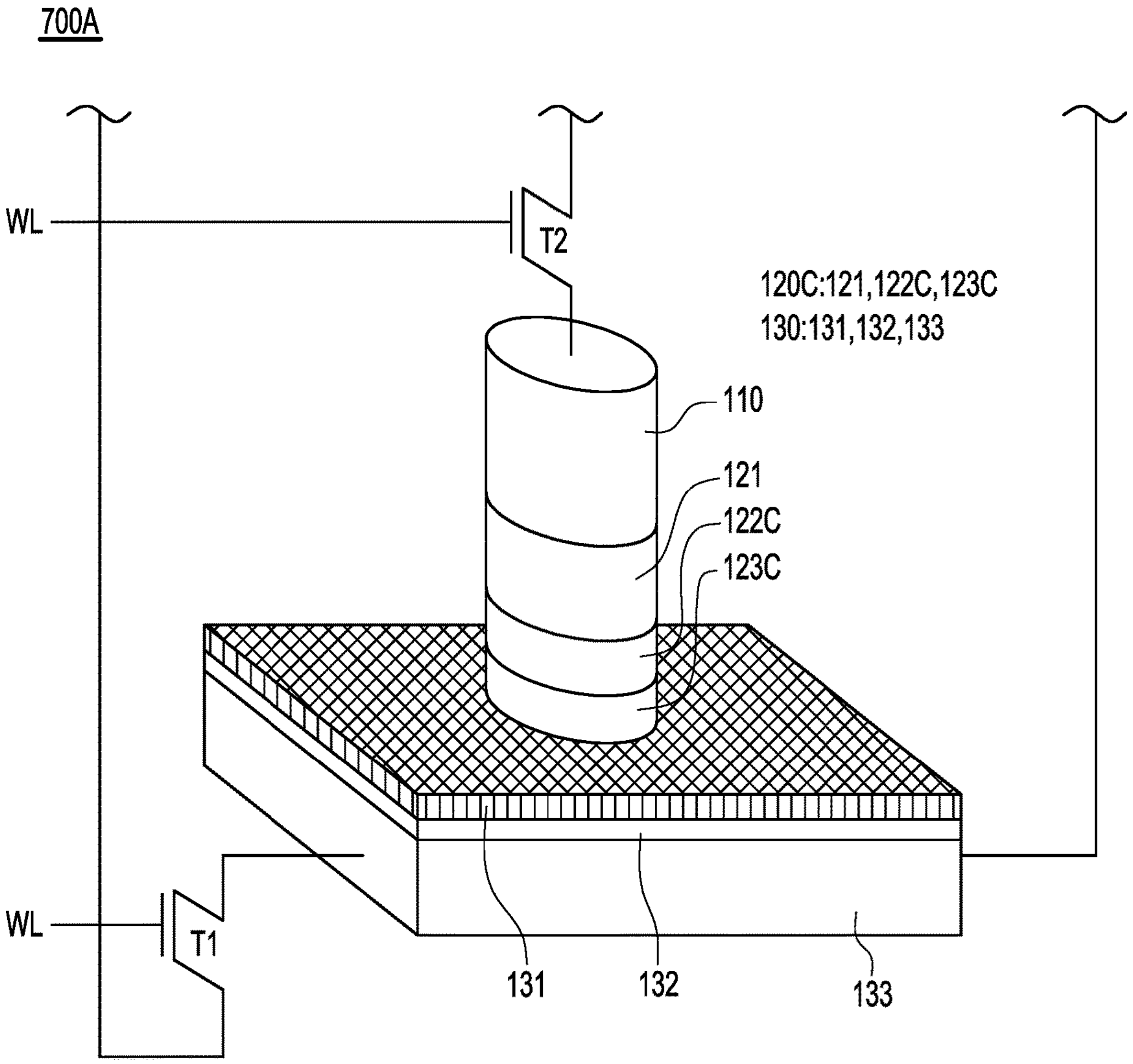

Please refer to FIG. 8C. FIG. 8C is similar to FIG. 1C, thus the similar features are not repeated here. The difference is the following. As illustrated in FIG. 8C, the magnetic memory structure 100A shown in FIG. 1C is replaced by the magnetic memory structure 700A.

Figure 8D:
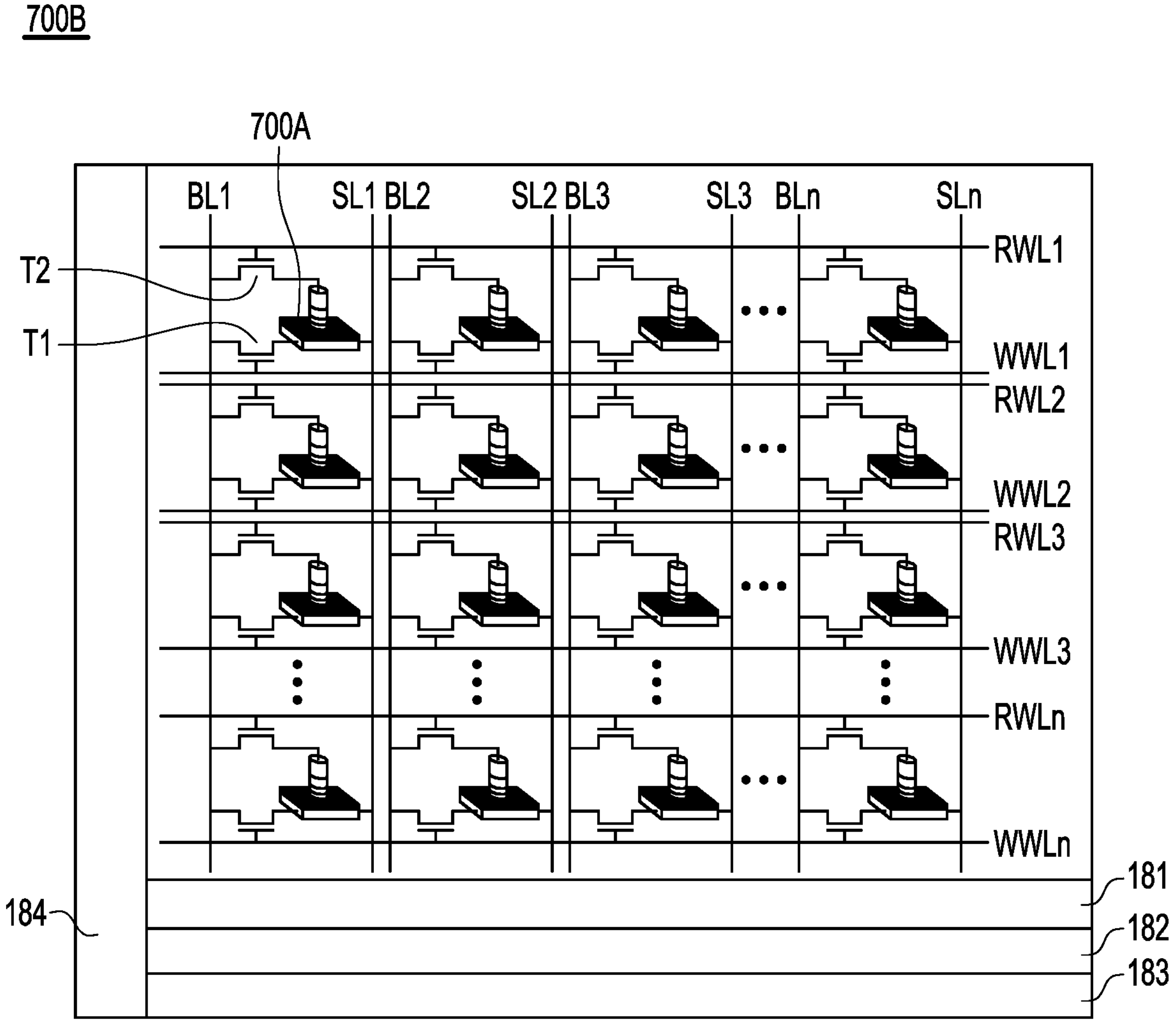
FIGS. 8D to 8E illustrate schematic diagrams of an array structure of a magnetic memory structure according to an embodiment of the present disclosure.
Figure 8E:
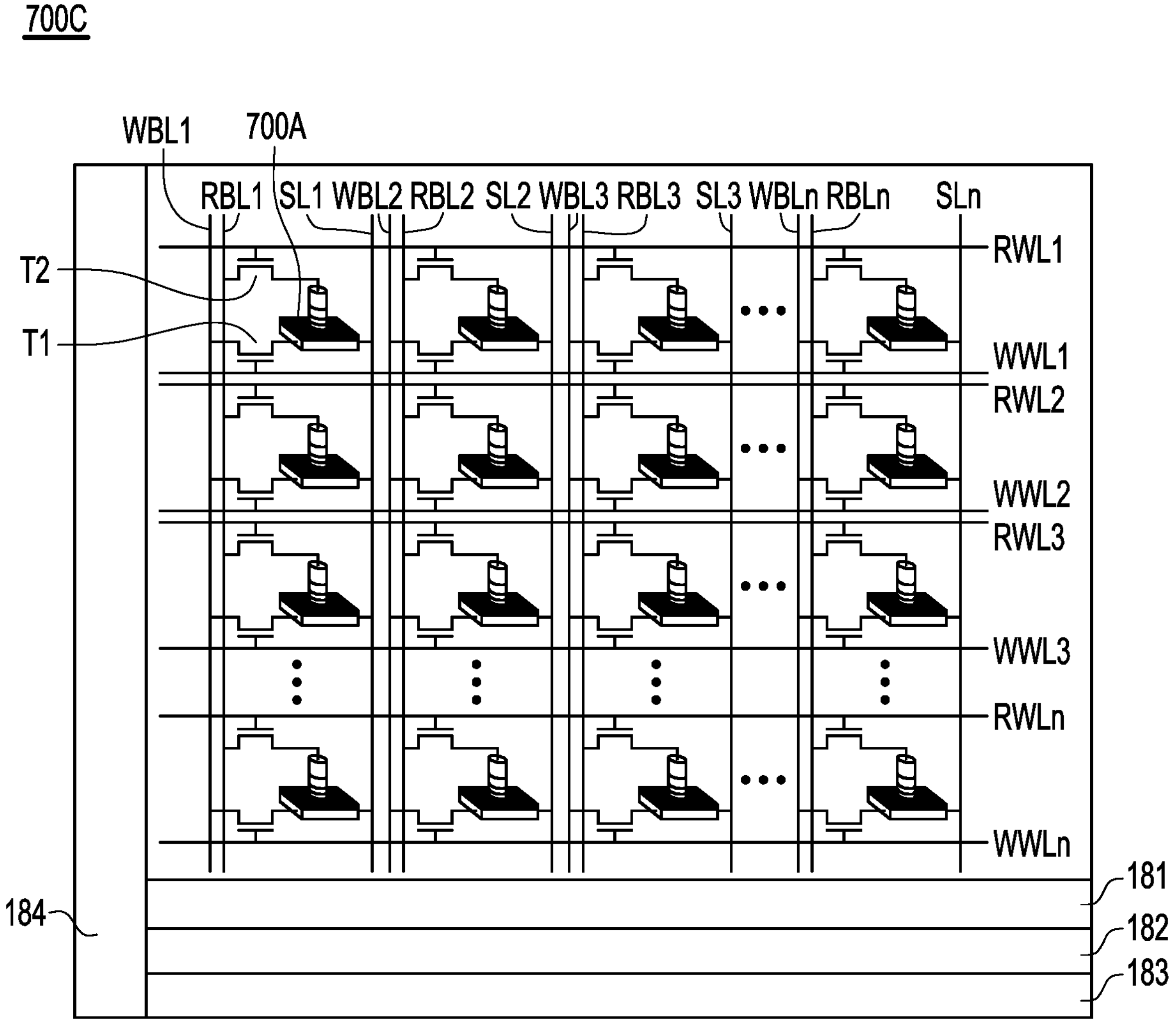

Please refer to FIGS. 8D and 8E. FIGS. 8D and 8E are a memory array 700B and a memory array 700C formed by the memory cells with magnetic memory structure 700A, as shown in FIG. 8A.

By replacing the memory cell of the memory array 800B and 800C from the magnetic memory structure 100A to magnetic memory structure 700A, since the area of the MTJ layer 120C are reduced, the size of the MTJ layer 120C is reduced. Thus, the memory array 700B and 700C may contain more memory cells.

Figure 9A:
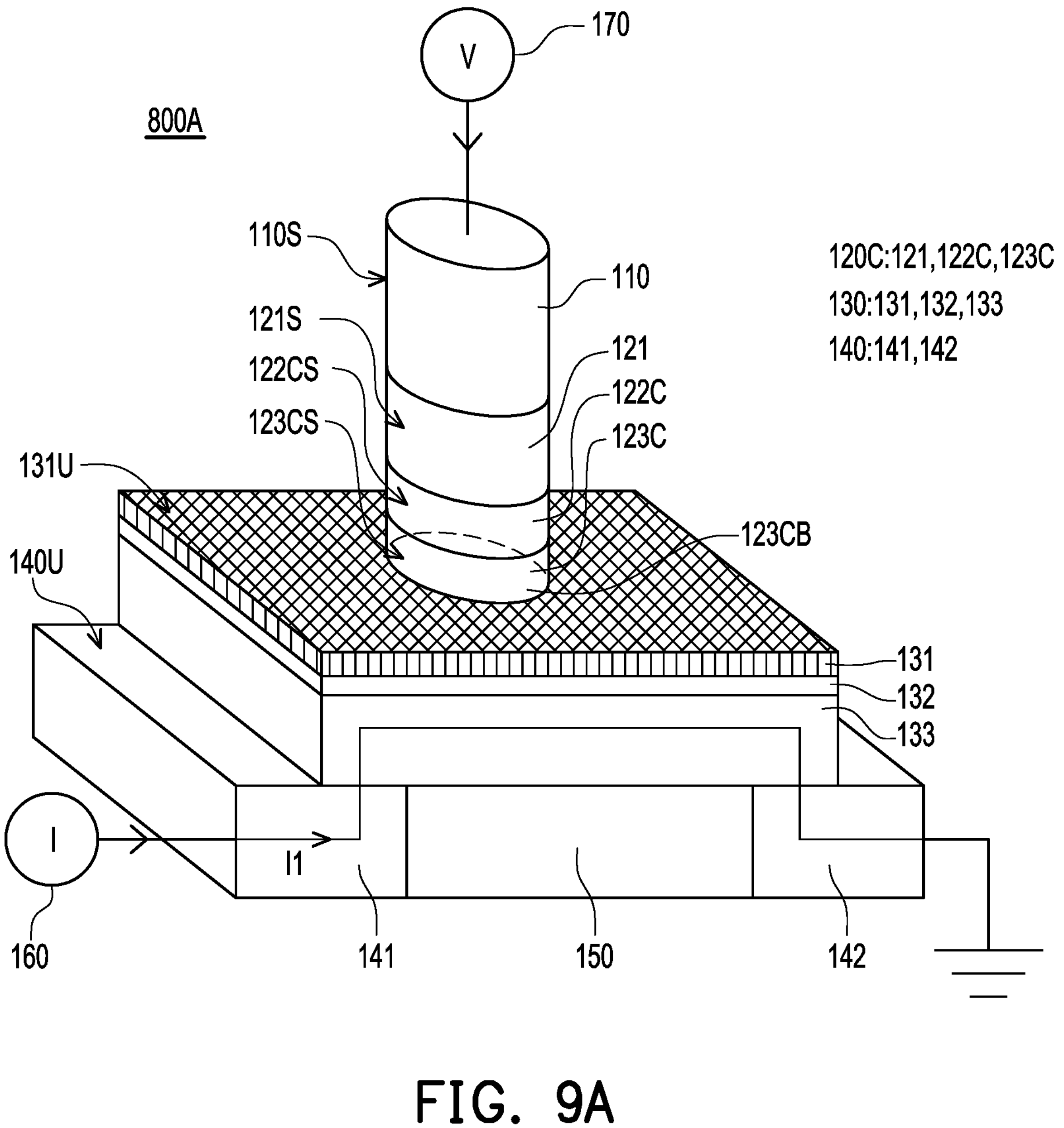
FIGS. 9A to 9C illustrate schematic diagrams of a magnetic memory structure according to an embodiment of the present disclosure.
Figure 9B:
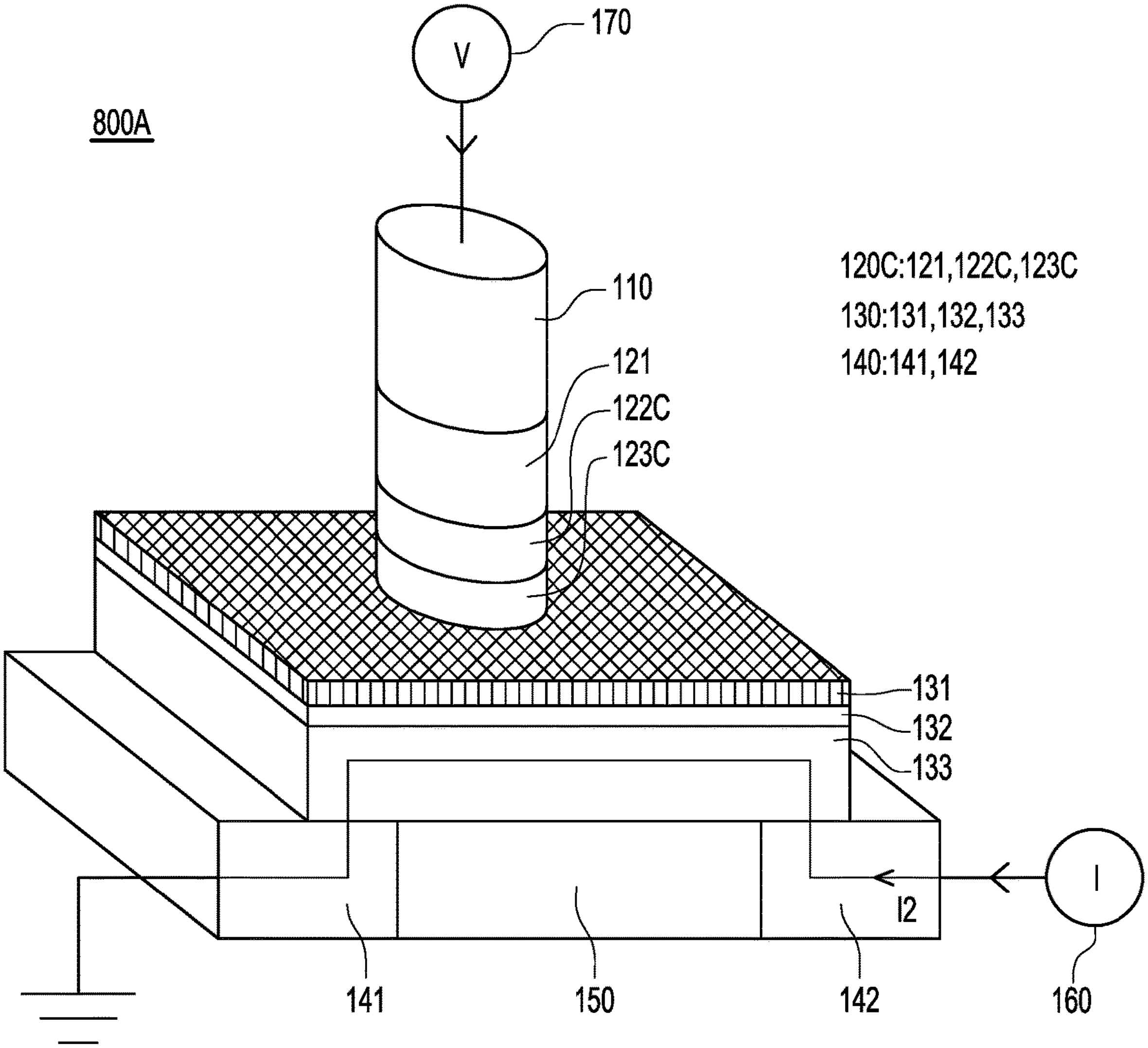

Referring to FIGS. 9A and 9B. FIGS. 9A and 9B illustrate schematic diagrams of a magnetic memory structure 800A according to an embodiment of the present disclosure. The magnetic memory structure 800A is similar to the magnetic memory structure 700A shown in FIGS. 8A and 8B, thus the similar features are not repeated here. In FIGS. 9A and 9B, the magnetic memory structure 800A further includes a conductive layer 140 being formed below the second heavy-metal layer 133. In comparison with the structure without the conductive layer 140, such as the magnetic memory structure 700A shown in FIGS. 8A and 8B, the conductive layer 140 in the present embodiment could increase the electric conductivity of the whole of the second heavy-metal layer 133 and the conductive layer 140, and thus it could decease the driving voltage for the electric current I1 of FIG. 8A and the electric current I2 of FIG. 8B.

Figure 9C:
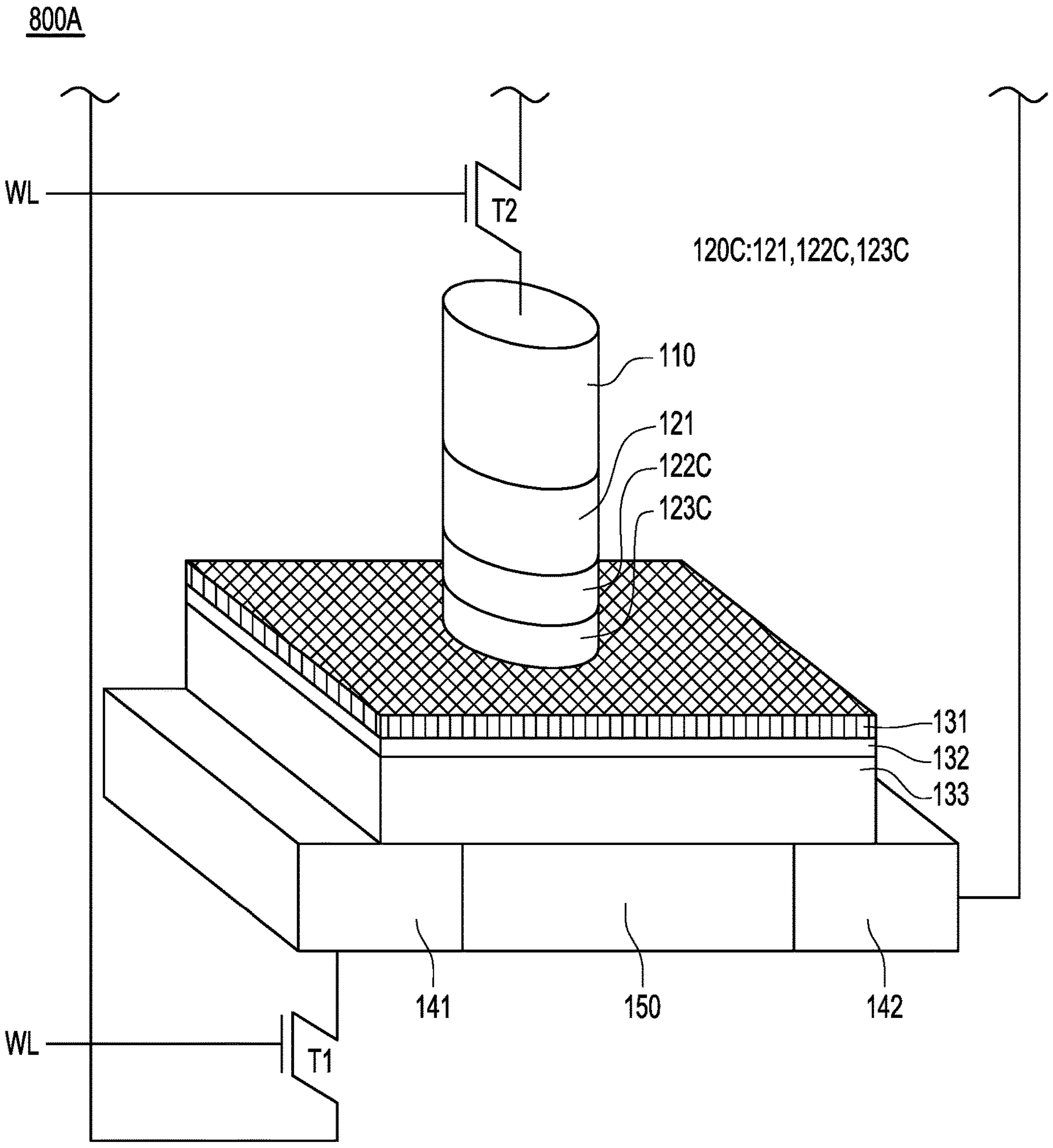

Please refer to FIG. 9C. FIG. 9C is similar to FIG. 8C, thus the similar features are not repeated here. The difference is the following. As illustrated in FIG. 8C, the first transistor T1 is connected to the first conductive portion 141. The passage of the electric current I1 or I2 to conductive layer 140 is controlled by the first transistor T1. Thus, the states of the free-layer 123A the MTJ layer 120A could be controlled/switched by the first transistor T1.

Figure 9D:
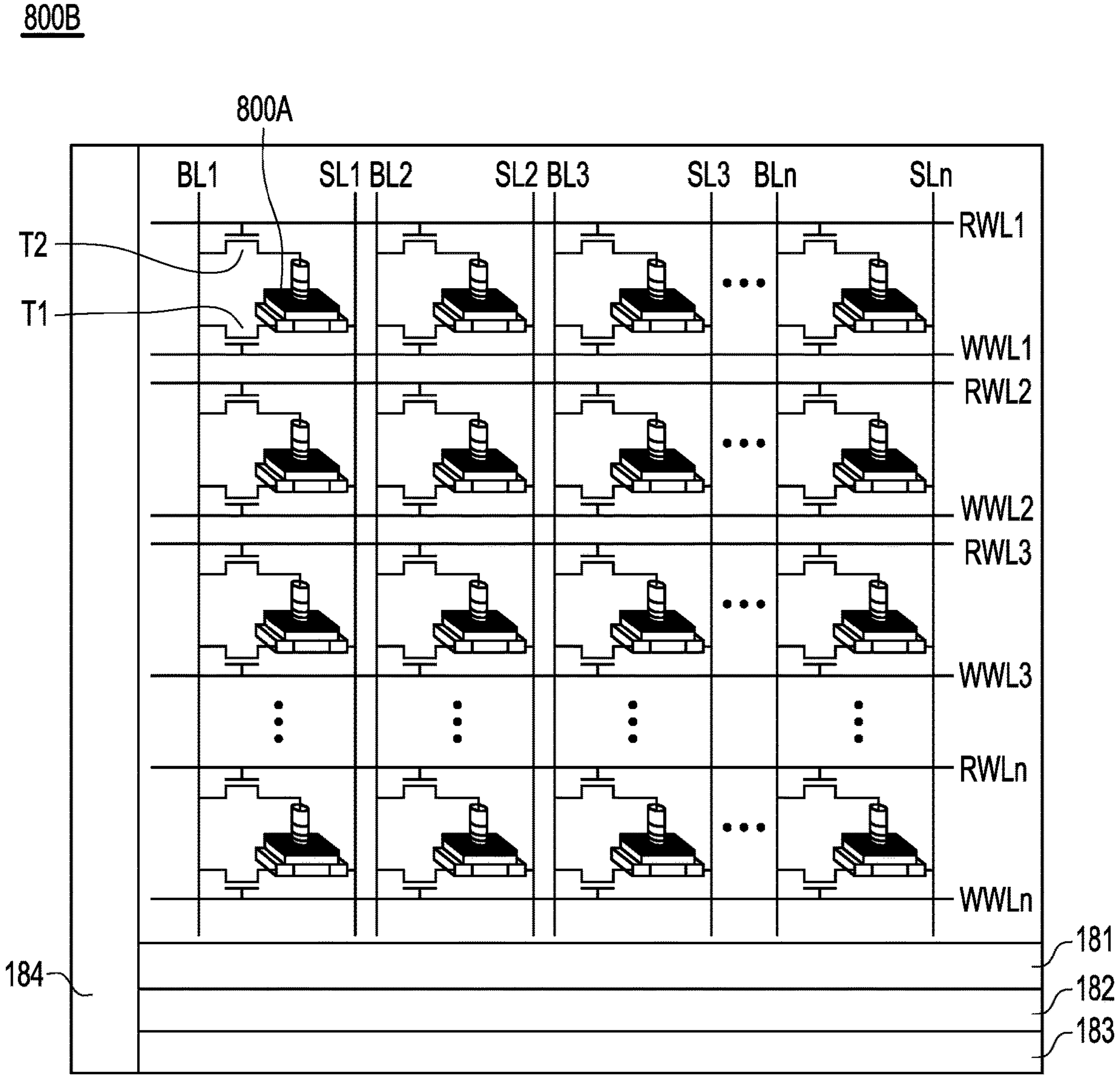
FIGS. 9D to 9E illustrate schematic diagrams of an array structure of a magnetic memory structure according to an embodiment of the present disclosure.
Figure 9E:
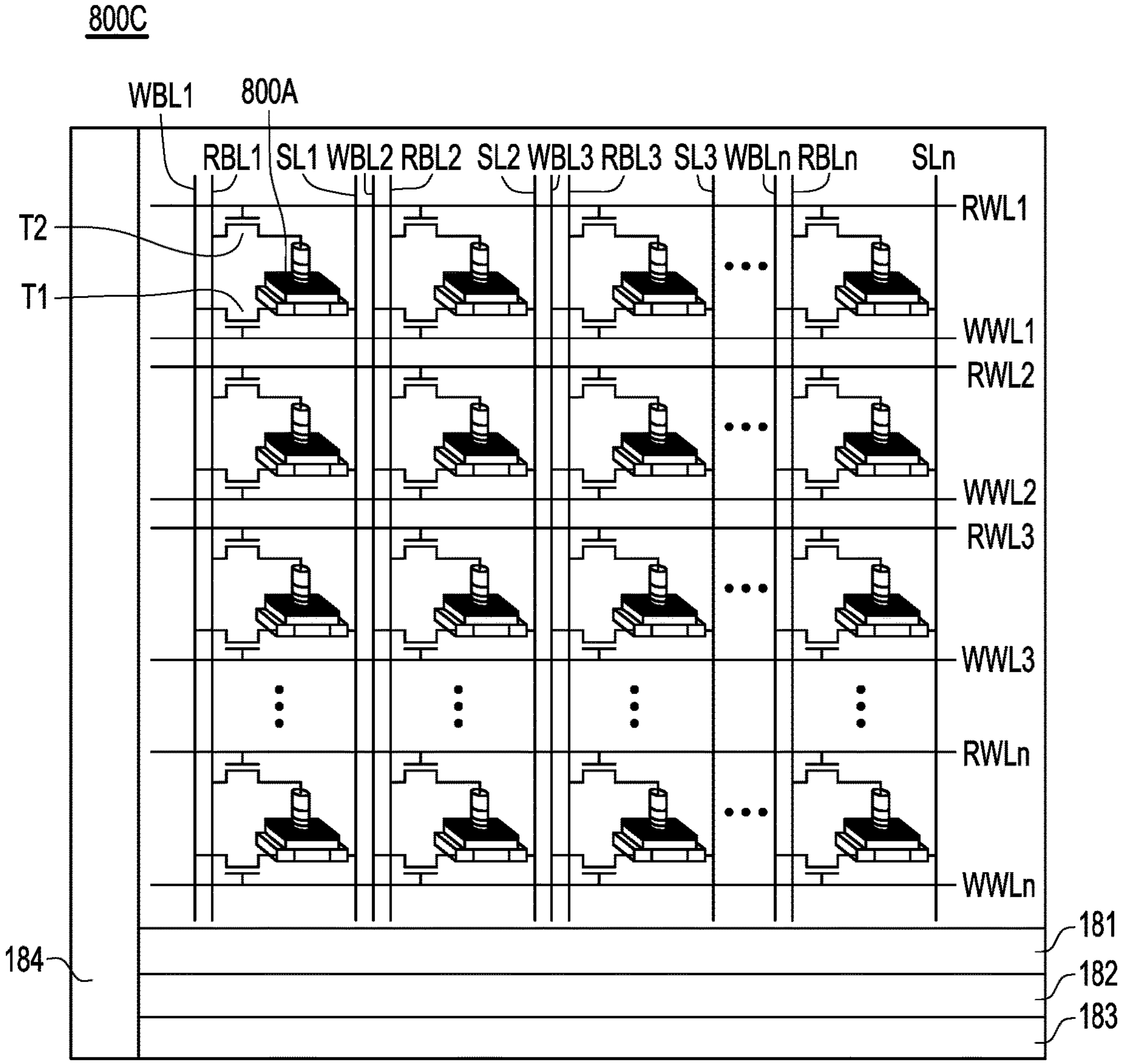

Please refer to FIGS. 9D and 9E. FIGS. 9D and 9E are a memory array 800B and a memory array 800C formed by the memory cells with magnetic memory structure 800A, as shown in FIG. 9A.

By replacing the memory cell of the memory array 800B and 800C from the magnetic memory structure 100A to magnetic memory structure 800A, since the area of the MTJ layer 120C are reduced, the size of the MTJ layer 120C is reduced. Thus, the memory array 800B and 800C may contain more memory cells.

In summary, according to the magnetic memory structures of the embodiments of the disclosure, by using a multi-layered heavy-metal structure including a first heavy-metal layer having a first work function, and a second heavy-metal layer having a second work function higher than the first work function. In this way, the switching thresholds of the magnetic memory with a multi-layered heavy-metal structure can be lower than those of a magnetic memory with a single heavy-metal layer structure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A magnetic memory structure, comprising:
- a plurality of magnetic tunneling junction (MTJ) layers, comprising:
  - a pinned-layer;
  - a barrier-layer formed under the pinned-layer; and
  - a free-layer formed under the barrier-layer; and
- a plurality of heavy-metal layers disposed under the free-layer,
- wherein an area of a bottom surface of the free-layer is smaller than an area of a layer of the plurality of heavy-metal layers adjacent to the free-layer,
- wherein a bottom surface of the pinned-layer is entirely located at a top surface of the barrier-layer.

2. The magnetic memory structure according to claim 1, wherein the plurality of heavy-metal layers comprises:
- a first heavy-metal layer with a first work function, formed under the free-layer;
- a second heavy-metal layer with a second work function, formed under the first heavy-metal layer, wherein the first work function is lower than the second work function; and
- an oxide layer formed between the first heavy-metal layer and the second heavy-metal layer.

3. The magnetic memory structure according to claim 2, wherein a thickness of the first heavy-metal layer is smaller than a thickness of the second heavy-metal layer.

4. The magnetic memory structure according to claim 2, wherein a lateral surface of the first heavy-metal layer, a lateral surface of the oxide layer, and a lateral surface of the second heavy-metal layer are aligned with each other.

5. The magnetic memory structure according to claim 1, wherein an area of the bottom surface of the pinned-layer is smaller than an area of the top surface of the barrier-layer.

6. The magnetic memory structure according to claim 1, wherein a lateral surface of the barrier-layer, a lateral surface of the free-layer, and a lateral surface of the plurality of heavy-metal layers are aligned with each other.

7. The magnetic memory structure according to claim 1, wherein a lateral surface of the barrier-layer, a lateral surface of the free-layer are aligned with each other, and a lateral surface of the plurality of heavy-metal layers extends from the lateral surface of the barrier-layer and the lateral surface of the free-layer.

8. The magnetic memory structure according to claim 1, wherein a bottom surface of the free-layer is entirely located at a top surface of a layer of the plurality of heavy-metal layers adjacent to the free-layer.

9. The magnetic memory structure according to claim 1, wherein a lateral surface of the free-layer shrinks from a lateral surface of the barrier-layer.

10. The magnetic memory structure according to claim 1, wherein an area of a top surface of the free-layer is smaller than an area of a bottom surface of the barrier-layer, and an area of a bottom surface of the free-layer is smaller than an area of a top surface of a layer of the plurality of heavy-metal layers adjacent to the free-layer.

11. The magnetic memory structure according to claim 1, wherein an area of a top surface of the free-layer is entirely located at an area of a bottom surface of the barrier-layer, and an area of a bottom surface of the free-layer is entirely located at an area of a top surface of a layer of the plurality of heavy-metal layers adjacent to the free-layer.

12. The magnetic memory structure according to claim 1, wherein a lateral surface of the pinned-layer, a lateral surface of the barrier-layer, and a lateral surface of the free-layer are aligned with each other.

13. The magnetic memory structure according to claim 1, wherein an area of a bottom surface of the free-layer is smaller than an area of a top surface of a layer of the plurality of heavy-metal layers adjacent to the free-layer.

14. The magnetic memory structure according to claim 1, wherein an area of a bottom surface of the free-layer is entirely located at an area of a top surface of a layer of the plurality of heavy-metal layers adjacent to the free-layer.

15. The magnetic memory structure according to claim 1, the magnetic memory structure further comprises:

a conductive layer, formed below the plurality of heavy-metal layers, wherein an electric conductivity of the conductive layer is higher than an electric conductivity of a layer of the plurality of heavy-metal layers adjacent to the conductive layer.

16. A magnetic memory structure, comprising:

a plurality of magnetic tunneling junction (MTJ) layers:

a plurality of heavy-metal layers, disposed below the plurality of MTJ layers; and a conductive layer, disposed below the plurality of heavy-metal layers, wherein the plurality of heavy-metal layers comprises a first heavy-metal layer and a second heavy-metal layer, and the first heavy-metal layer and the second heavy-metal layer is separated by an oxide layer, wherein the first heavy-metal layer is disposed below the plurality of MTJ layers, wherein the conductive layer is disposed below the second heavy-metal layer, wherein an electric conductivity of the conductive layer is higher than an electric conductivity of the second heavy-metal layer, wherein an area of a bottom surface of the free-layer is smaller than an area of a layer of the plurality of heavy-metal layers adjacent to the free-layer, wherein the plurality of MTJ layers comprises:

a pinned-layer;

a barrier-layer formed under the pinned-layer; and a free-layer formed under the barrier-layer and above the first heavy-metal layer, wherein a bottom surface of the pinned-layer is entirely located at a top surface of the barrier-layer.

17. The magnetic memory structure according to claim 16, wherein a work function of the first heavy-metal layer is lower than a work function of the second heavy-metal layer.

18. The magnetic memory structure according to claim 16, wherein the conductive layer comprises a first conductive portion and a second conductive portion, wherein the first conductive portion and the second conductive portion are separated by an insulating layer, and the first conductive portion and the second conductive portion are connected to two ends of the second heavy-metal layer.

19. The magnetic memory structure according to claim 16, wherein a portion of a top surface of the conductive layer is exposed from the plurality of heavy-metal layers.

20. The magnetic memory structure according to claim 16, wherein a lateral surface of the conductive layer extends beyond a lateral surface of the plurality of heavy-metal layers.

* * * * *